US006690455B2

(12) United States Patent
Fujinaka

(10) Patent No.: US 6,690,455 B2
(45) Date of Patent: Feb. 10, 2004

(54) ILLUMINANCE MEASUREMENT APPARATUS AND EXPOSURE APPARATUS

(75) Inventor: Tsuyoshi Fujinaka, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 235 days.

(21) Appl. No.: 09/813,857

(22) Filed: Mar. 22, 2001

(65) Prior Publication Data

US 2001/0050769 A1 Dec. 13, 2001

(30) Foreign Application Priority Data

Mar. 24, 2000 (JP) ........................................ 2000-083627
Jan. 31, 2001 (JP) ........................................ 2001-023812

(51) Int. Cl.$^7$ ................................ G01J 1/00; G01J 1/42
(52) U.S. Cl. ........................................ 356/121; 356/218
(58) Field of Search ........................... 356/121, 213, 356/218, 399–401, 221; 355/53, 55, 67, 68, 43

(56) References Cited

U.S. PATENT DOCUMENTS 6,115,107 A  * 9/2000 Nishi ........................... 355/68
6,549,277 B1 * 4/2003 Narushima et al. ......... 356/218

FOREIGN PATENT DOCUMENTS

JP  10-092722  *  4/1998
JP  11260706 A  *  9/1999  ......... H01L/21/027

\* cited by examiner

*Primary Examiner*—Zander V. Smith
*Assistant Examiner*—Gordon J Stock
(74) *Attorney, Agent, or Firm*—Oliff & Berridge PLC

(57) ABSTRACT

An illuminance measurement apparatus for measuring the illuminance of illumination light on an image plane of a projection optical system of an exposure apparatus designed to project the image of a pattern from an illuminated mask on a substrate held on a substrate stage by the projection optical system, including an illuminance meter detachably attached to the substrate stage, the illuminance meter having an illuminance detector, a transmitter for wirelessly transmitting a measurement result of the illuminance detector, a storage cell, and a photoelectric converter for converting part of the illumination light photoelectrically and storing it in the storage cell, and a receiver for receiving the wireless signal including the measurement results transmitted by the transmitter.

30 Claims, 15 Drawing Sheets

ILLUMINANCE MEASUREMENT APPARATUS AND EXPOSURE APPARATUS

BACKGROUND OF THE INVENTION

1. Field of the Invention

The present invention relates to an illuminance measurement apparatus and exposure apparatus, more particularly relates to an illuminance measurement apparatus used for measuring relative illuminances among a plurality of exposure apparatuses and an exposure apparatus provided with such an illuminance measurement apparatus, an exposure apparatus able to detect an exposure beam or a beam other than one used for exposure of a substrate, and a method of production of a device using such an exposure apparatus.

2. Description of the Related Art

When producing a semiconductor device or liquid crystal display device etc., a projection exposure apparatus is used for transferring a pattern drawn on a mask or reticle (hereinafter also referred to all together as a "mask") or other master on to a semiconductor wafer or transparent substrate coated with a resist or other photosensitive substrate. The production lines for semiconductor devices or liquid crystal display devices do not use single projection exposure apparatuses. In general, a plurality of projection exposure apparatuses are used together.

In such a case, to reduce the variations in products made by the different exposure apparatuses, it is necessary to match the exposure quantities among the exposure apparatuses. For this purpose, an internal photo sensor (integrator sensor etc.) is provided in each exposure apparatus. This measures the illuminance on the image plane indirectly. The exposure quantity is matched among the exposure apparatuses based on the results of measurement. The internal photo sensor provided in each exposure apparatus, however, does not always detect the accurate illuminance. Error sometimes occurs along with the elapse of time etc. It is therefore necessary to calibrate the internal photo sensors.

Further, to coordinate the throughputs of processing of the different exposure apparatuses, it is necessary to centrally manage the relative illuminances.

Therefore, an inter-apparatus illuminance meter has been used to measure the relative illuminance among exposure apparatuses. This illuminance meter is designed to be able to be freely attached to a special mount (adapter) provided near a wafer holder of a wafer stage. A worker manually attaches (plugs in) the illuminance meter to the adapter and directly measures the illuminance on the image plane. After finishing the measurement of the illuminance, the worker detaches the illuminance meter from the adapter, then successively performs the same work on other exposure apparatuses so as to measure the illuminance of the exposure apparatuses.

Various cables such as the cable for the supply of power and the cable for transmission of a signal for reading the result of measurement of the illuminance meter are connected to the illuminance meter. These cables obstruct movement or break at the time of movement of the wafer stage making measurement of the illuminance impossible. Alternatively, time is required for restoration. Sometimes the down time of the exposure processing becomes longer. Further, a sensor used for measurement of the illuminance distribution, sensors used for measurement of the alignment or the optical characteristics of the projection optical system, etc. are also provided on the wafer stage. There are similar problems with such sensors. Further, the same is true when providing a sensor for receiving exposure illumination light at the reticle stage.

SUMMARY OF THE INVENTION

An object of the present invention is to enable reliable measurement of the illuminance within a predetermined time.

Another object of the present invention is to enable the reliable detection of illumination light even if at least some of the photodetectors receiving illumination light for exposure or illumination light used for other than exposure of the substrate are provided on a moving member.

To achieve the above object, the illuminance measurement apparatus of the present invention is an illuminance measurement apparatus for measuring the illuminance of illumination light on an image plane of a projection optical system of an exposure apparatus designed to project the image of a pattern from an illuminated mask on a substrate held on a substrate stage by the projection optical system, comprising an illuminance meter having an illuminance detector and a transmitter for wirelessly transmitting the measurement results of the illuminance detector and attached detachably to the substrate stage and a receiver for receiving a wireless signal including the measurement result transmitted from the transmitter.

According to the illuminance measurement apparatus of the present invention, since the measurement results of the illuminance detector are wirelessly transmitted, there is no longer the need to connect cables for transmitting the measurement results to the illuminance detector. Therefore, even if the illuminance meter is moved, it is possible to prevent obstacles to movement, breakage, etc. arising due to connection of the cable and possible to reliably measure the illuminance.

Further, to achieve the above object, the illuminance measurement apparatus of the present invention is an illuminance measurement apparatus for measuring the illuminance of illumination light on an image plane of a projection optical system of an exposure apparatus designed to project the image of a pattern from an illuminated mask on a substrate held on a substrate stage by the projection optical system, wherein the illuminance meter has a storage cell and a photoelectric converter for converting at least part of the illumination light photoelectrically and storing it in the storage cell.

According to the illuminance measurement apparatus of the present invention, since part or all of the illumination light is converted photoelectrically and stored in a storage cell, it is possible to use this as a power source for operating the illuminance meter and thereby possible to eliminate the power cable. Therefore, even if the illuminance meter is moved, it is possible to prevent obstacles to movement, breakage, etc. arising due to connection of the cable and possible to reliably measure the illuminance.

Further, to achieve the above object, the exposure apparatus of the present invention is provided with an illuminance measurement apparatus of the present invention.

According to the exposure apparatus of the present invention, since there is no trouble such as breakage of cables etc., the illuminance can be measured quickly in a predetermined time. Therefore, even when measuring the illuminance by interrupting the exposure processing by the exposure apparatus, it is possible to shorten the down time of the exposure processing as planned and in turn to improve the throughput (productivity) of the system as a whole.

To achieve the above object, the exposure apparatus of the present invention is an exposure apparatus for emitting a first beam for exposure on a mask and exposing a substrate through the mask by the first beam, provided with a photodetector provided on a movable member moving relatively with respect to the first beam or a second beam used for other than exposure of the substrate and wirelessly transmitting information obtain by receiving at least part of the first beam or the second beam and a receiver arranged separate from the movable member and receiving the information. In this case, the movable member can include a stage for holding the mask or the substrate. Further, the movable member can include a built-in storage device for storing energy to be supplied to the photodetector. In addition, further provision may be made of an energy generator for receiving at least one of the first and second beams and generating energy to be stored in the storage device.

To achieve the above object, another illuminance measurement apparatus of the present invention is an illuminance measurement apparatus provided with a holder type illuminance meter comprised of a dummy holder configured to be able to be attached to a substrate stage interchangeably with a substrate holder for holding a substrate and a probe for measurement of the illuminance, a transmitter for wirelessly transmitting measurement results of the probe, and a battery for supplying power to the probe and the transmitter provided on the same. In this case, the probe can be configured to be attached to the dummy holder. Further, provision may be made of a receiver for receiving a wireless signal including the measurement results transmitted by the transmitter. The holder type illuminance meter preferably has a photoelectric converter for converting the received light photoelectrically and storing it in the battery.

According to this illuminance measurement apparatus of the present invention, it is possible to measure the illuminance by detaching the substrate holder from the substrate stage and instead attaching the holder type illuminance meter on the substrate stage. Therefore, there is no need for a special device for separately attaching the illuminance meter on the substrate stage. Further, since the measurement results are wirelessly transmitted, there is no need for connection of a cable for transmitting the measurement results. Further, when the exposure apparatus in which the illuminance measurement apparatus is used is provided with an automatic transporter or automatic exchanger for the substrate holder, it is possible to use these devices to transport or exchange the holder type illuminance meter, so it is possible to measure the illuminance with a high efficiency.

To achieve the above object, another exposure apparatus of the present invention is an exposure apparatus for emitting a first beam for exposure on a mask and exposing a substrate through the mask by the first beam, provided with a substrate stage to which a substrate holder for holding the substrate can be detachably attached, a holder type illuminance meter comprised of a dummy holder configured to be able to be attached to the substrate stage interchangeably with the substrate holder and a probe for receiving at least part of the first beam or second beam and converting it photoelectrically, a transmitter for wirelessly transmitting information obtained from the probe, a battery for supplying power to the probe and the transmitter provided on the same, and a receiver arranged separate from the substrate stage and receiving a wireless signal including the measurement results transmitted from the transmitter. In this case, the probe can be configured to be able to be detachably attached to the dummy holder. Further, provision may be made of an energy generator for receiving at least one of the first and second beams and generating energy to be stored in the battery.

Further, the method of production of a device of the present invention for achieving the above object includes a step of transferring a device pattern on to a sensitive substrate using the exposure apparatus or another exposure apparatus.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, an explanation will be given of embodiments of the present invention with reference to the drawings.

[First Embodiment]

Figure 1:
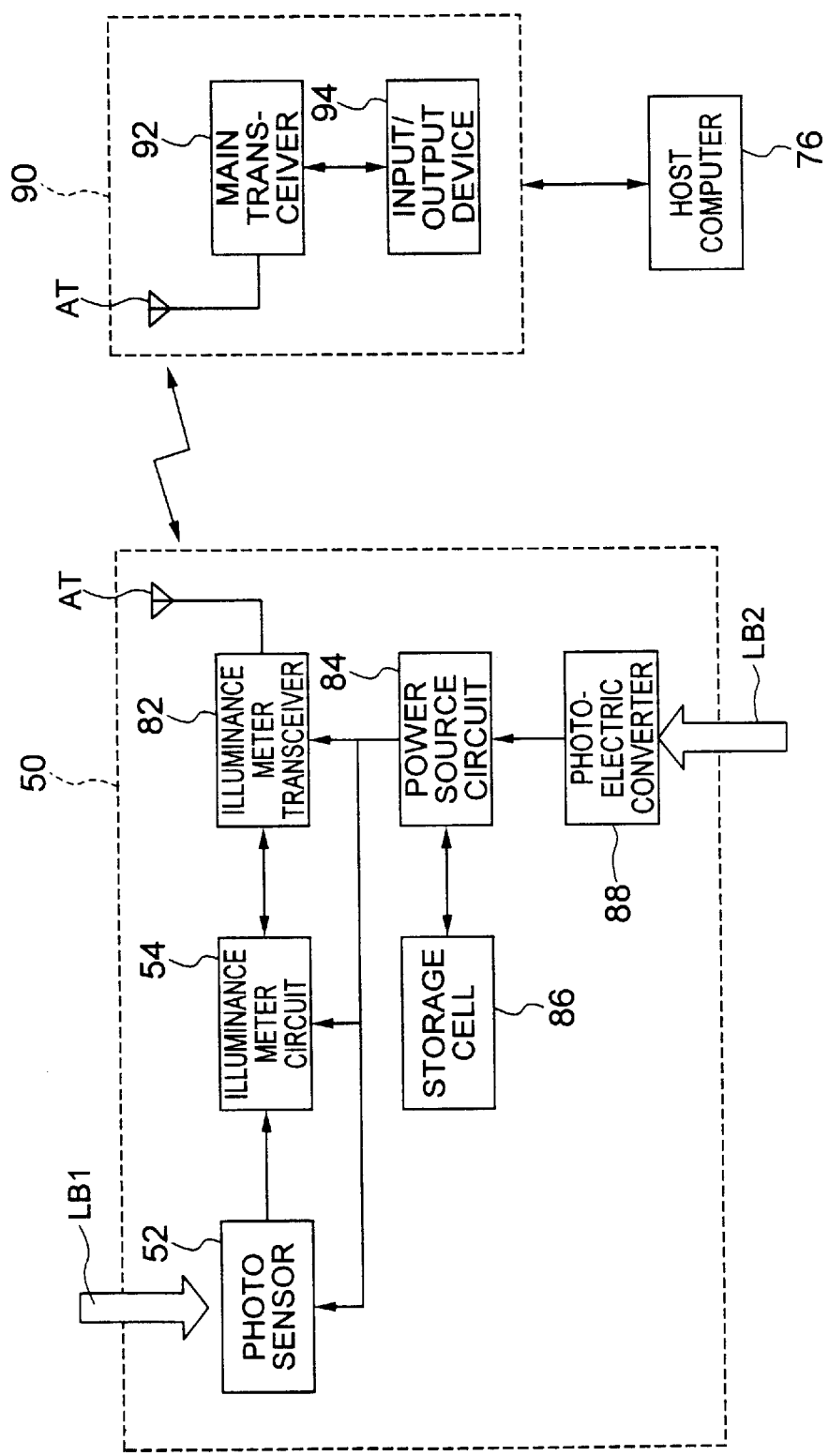
FIG. 1 is a block diagram of the overall configuration of an illuminance measurement apparatus according to a first embodiment of the present invention.
Figure 2:
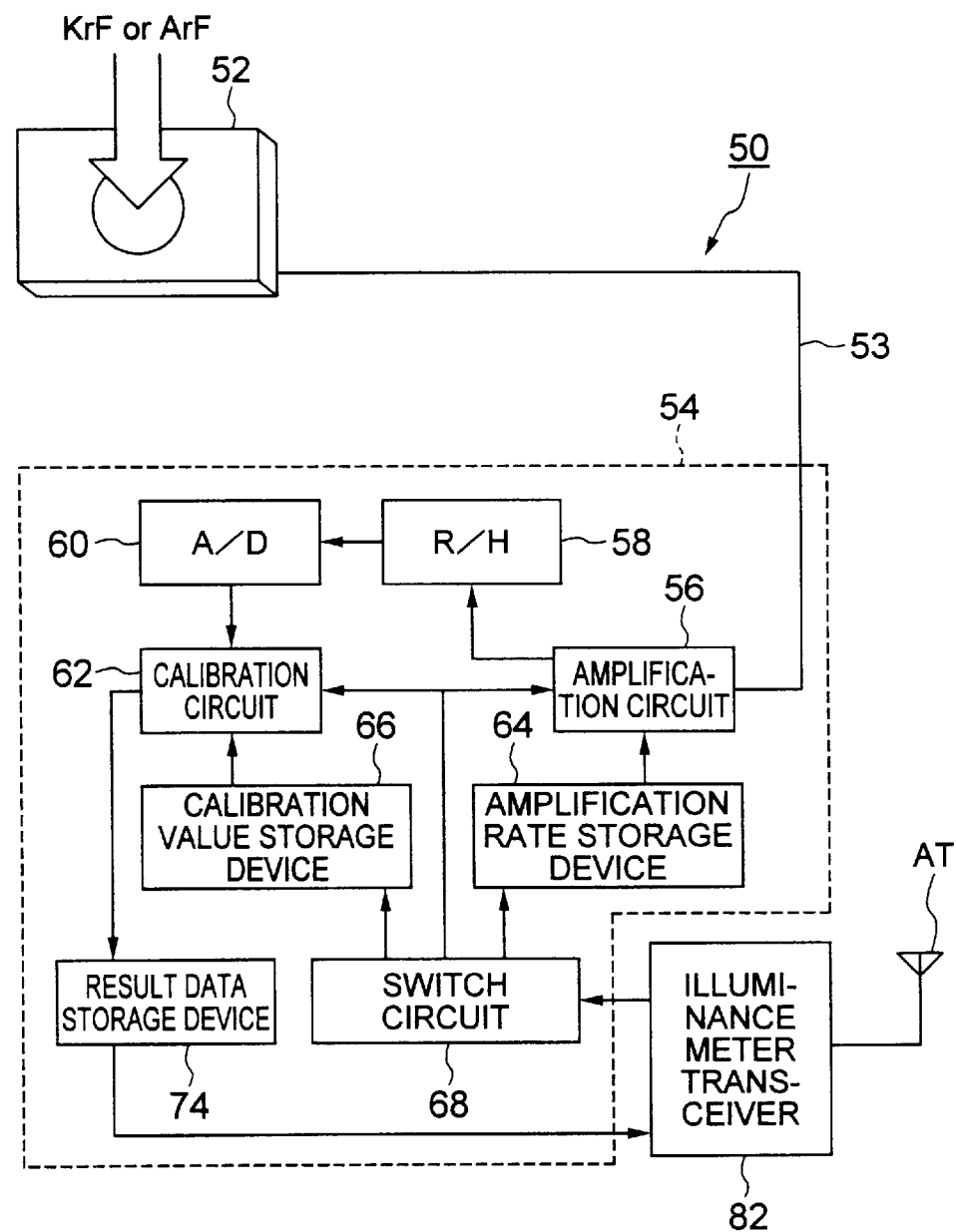
FIG. 2 is a block diagram of the detailed configuration of an illuminance meter according to the first embodiment of the present invention.
Figure 3:
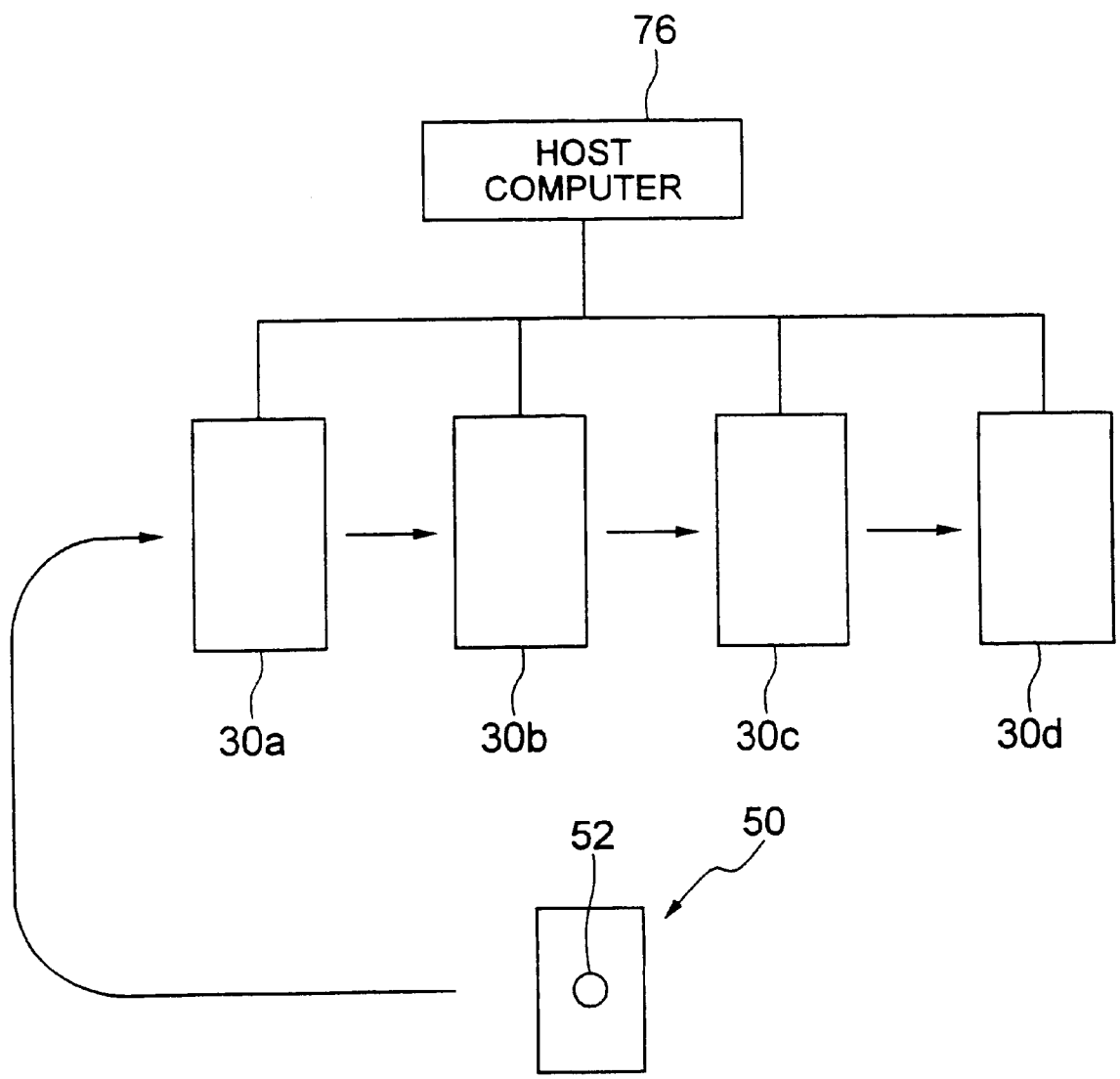
FIG. 3 is a schematic view of the configuration of a lithography system according to the first embodiment of the present invention.
Figure 4:
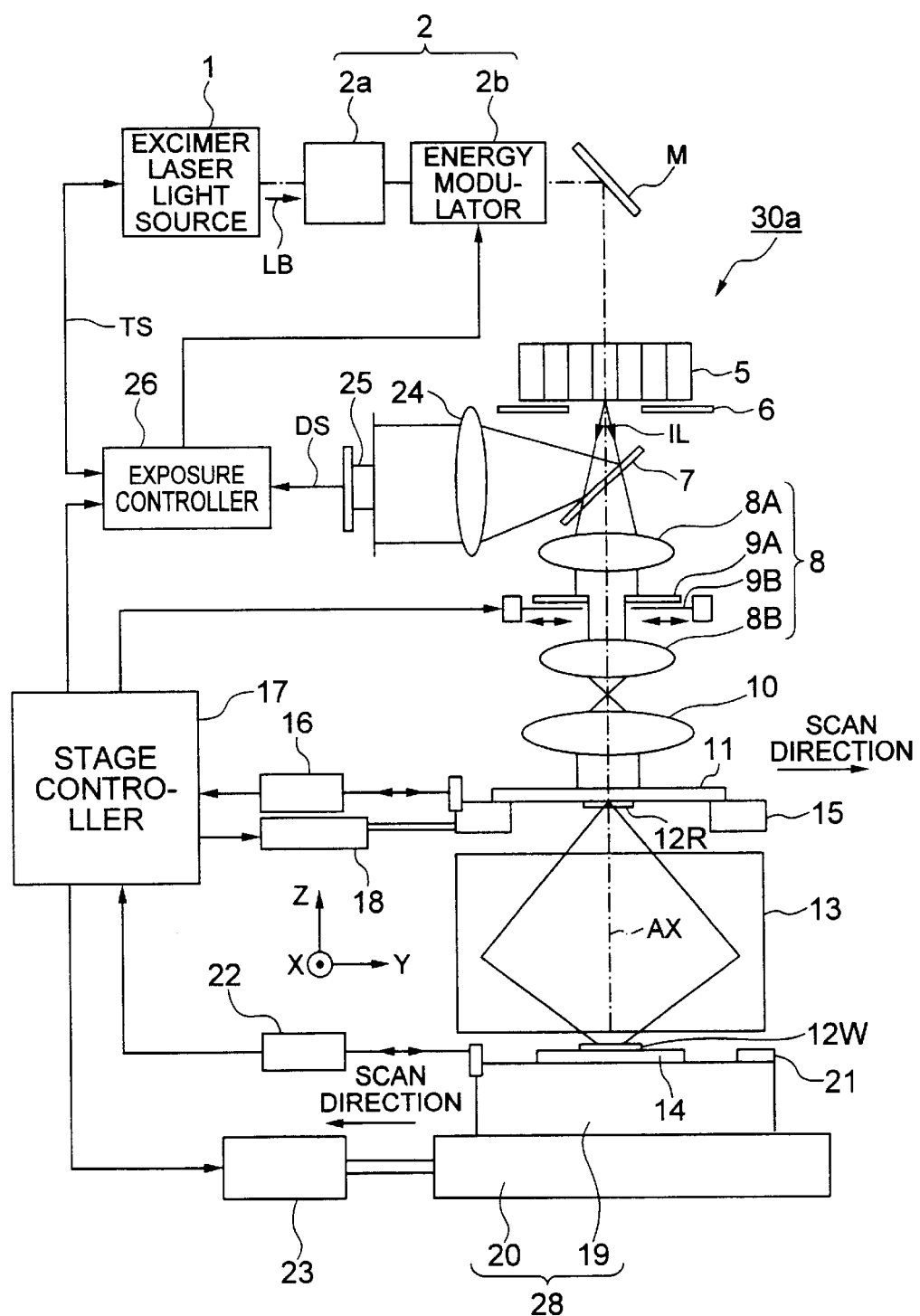
FIG. 4 is a schematic view of the configuration of an exposure apparatus according to the first embodiment of the present invention.
Figure 5:
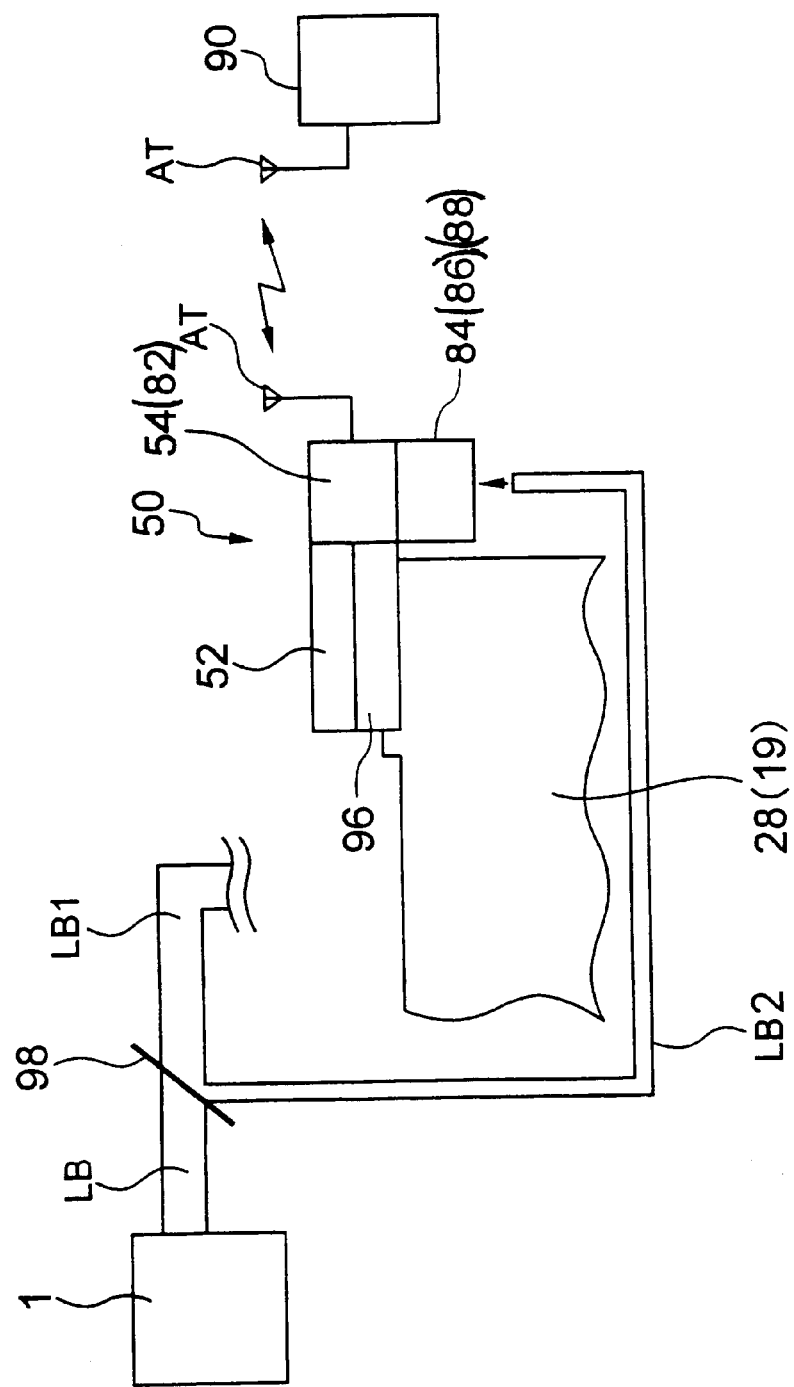
FIG. 5 is a schematic view of principal parts of the exposure apparatus according to the first embodiment of the present invention.
Figure 6:
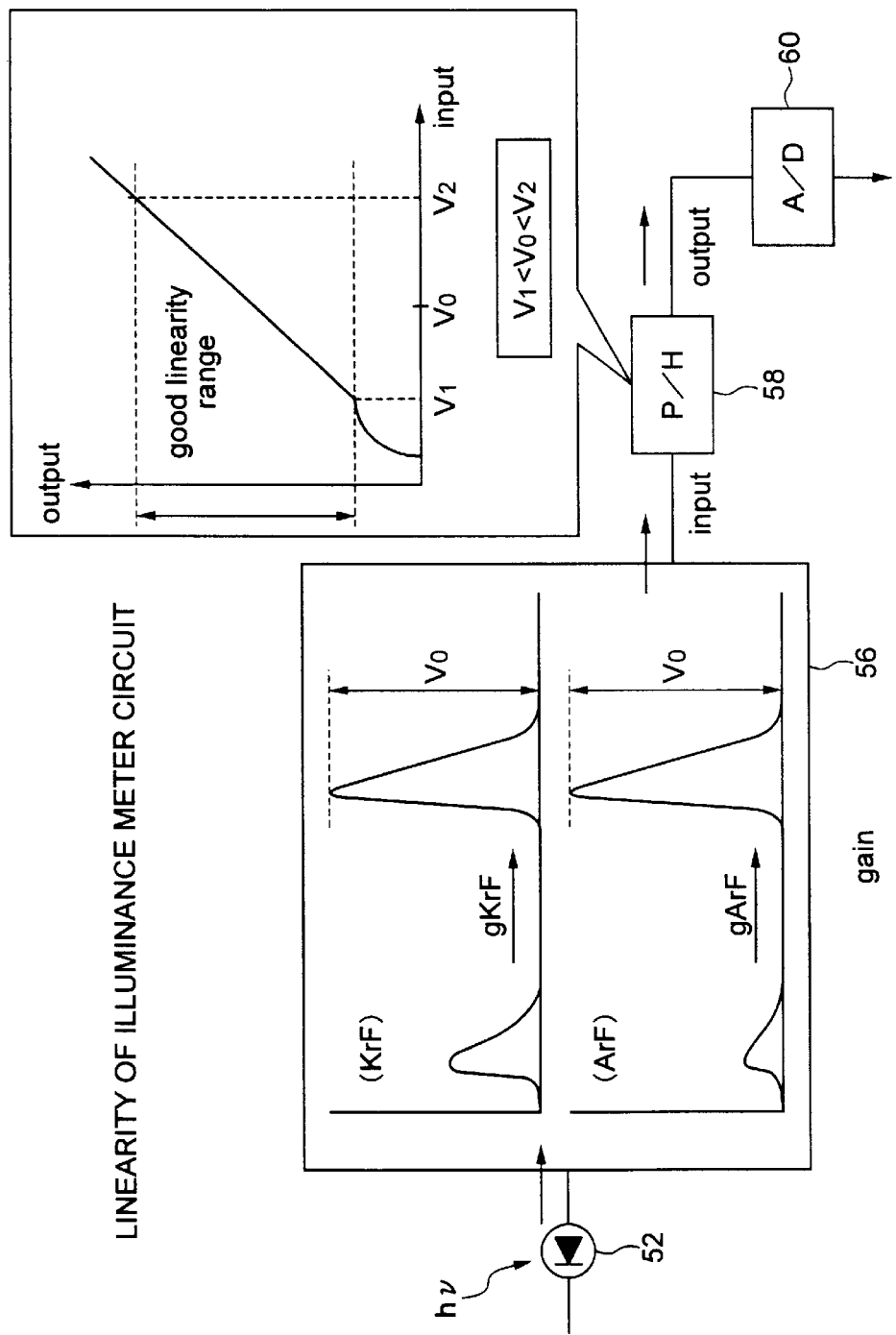
FIG. 6 is a schematic view of the characteristics of the principal circuits in the illuminance meter according to the first embodiment of the present invention.
Figure 7:
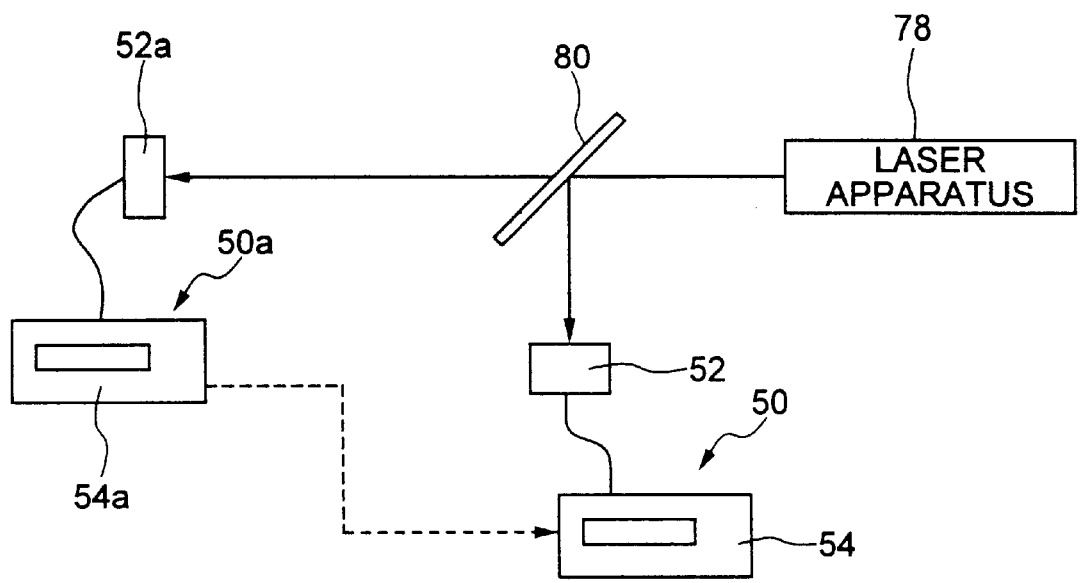
FIG. 7 is a schematic view of an example of the method of calibration of the illuminance meter according to the first embodiment of the present invention.

FIG. 1 is a block diagram of the overall configuration of an illuminance measurement apparatus according to a first embodiment of the present invention; FIG. 2 is a block diagram of the detailed configuration of an illuminance measurement apparatus according to the first embodiment of the present invention; FIG. 3 is a schematic view of the configuration of a lithography system according to the first embodiment of the present invention; FIG. 4 is a schematic view of the configuration of an exposure apparatus according to the first embodiment of the present invention; FIG. 5 is a schematic view of principal parts of the exposure apparatus according to the first embodiment of the present invention; FIG. 6 is a schematic view of the characteristics of the principal circuits in the illuminance meter according to the first embodiment of the present invention; and FIG. 7 is a schematic view of an example of the method of calibration of the illuminance meter according to the first embodiment of the present invention.

(1) Lithography System

The lithography system to which the present invention is applied is a system for producing a semiconductor device as an example of a microdevice. As shown in FIG. 3, it is comprised of a combination of an exposure apparatus 30a using a KrF excimer laser as the illumination light source for exposure and exposure apparatuses 30b to 30d using ArF excimer lasers as the illumination light source for exposure. These two types of exposure apparatuses 30a to 30d are connected to the same host computer 76. Their operating states are monitored for control of production. The illuminances of the exposure apparatuses 30a to 30d are measured by an illuminance meter 50 serving as an inter-apparatus illuminance meter and used for matching the amounts of exposure among the exposure apparatuses. Note that in this embodiment, the explanation was made of a system including a combination of two types of exposure apparatuses with different light sources, but the system may also be one configured by a plurality of a single type of exposure apparatus or one configured by a plurality of types of exposure apparatuses.

(2) Optical System of Exposure Apparatus

First, an explanation will be given of an optical system of mainly one exposure apparatus 30a based on FIG. 4. The explanation of other exposure apparatuses 30b to 30d shown in FIG. 3 will be omitted, but the basic configurations are the same as that shown in FIG. 4. Only the type of light source for the exposure illumination light differs.

As shown in FIG. 4, the exposure apparatus 30a according to the present embodiment is an exposure apparatus of the so-called "step-and-scan" system. By moving the reticle 11 and wafer 14 synchronously with respect to the projection optical system 13 in a state while projecting, reducing, and exposing part of a pattern on a reticle 11, as an example of a mask, on a wafer 14 coated with a resist, as an example of a substrate, through the projection optical system 13, a reduced image of the pattern on the reticle 11 is sequentially transferred to the shot areas of the wafer 14 to produce a semiconductor device on the wafer 14.

The exposure apparatus 30a of the present embodiment has a KrF excimer laser (oscillation wavelength 248 nm) as the exposure light source 1. The laser beam LB emitted as a pulse from the exposure light source 1 enters the beam shaping and modulating optical system 2. In the present embodiment, the beam shaping and modulating optical system 2 is comprised of a beam shaping optical system 2a and an energy modulator 2b. The beam shaping optical system 2a is comprised of a cylinder lens or a beam expander etc. Due to this, the beam is shaped in sectional shape so as to efficiently enter the following optical integrator (fly-eye lens 5 in FIG. 4).

The energy modulator 2b shown in FIG. 4 is configured by a rough energy adjuster and a fine energy adjuster. The rough energy adjuster is comprised of a plurality of ND filters with difference transmittances (1−attenuation rate)× 100 (%)) on a rotatable revolver. By rotating the revolver, it is possible to switch the transmittance with respect to the incident laser beam LB in a plurality of stages from 100%. Note that it is also possible to provide two revolvers similar to this revolver and combine two ND filters so as to enable finer adjustment of the transmittance. On the other hand, the fine energy adjuster continuously finely adjusts the transmittance with respect to the laser beam LB in a predetermined range by a double grating system or a system of a combination of two sheets of parallel flat glass able to be adjusted in inclination angle. Instead of using the fine energy adjuster, it is also possible to finely adjust the energy of the laser beam LB by modulation of the output of the excimer laser light source 1.

In FIG. 4, the laser beam LB emitted from the beam shaping and modulating optical system 2 enters the fly-eye lens 5 through an optical path bending mirror M. Note that it is also possible to use an inside surface reflection type integrator (rod integrator etc.) or a diffraction optical element etc. as the optical integrator.

The fly-eye lens 5 forms a surface light source comprised of a large number of light source images for illuminating the following reticle 11 by a uniform illuminance distribution, that is, a secondary light source. As shown in FIG. 4, an aperture stop (so-called "σ-stop") 6 is arranged at the emission face of the fly-eye lens 5. The laser beam emitted from the secondary light source inside the aperture stop 6 (hereinafter called "pulse illumination light IL") enters the beam splitter 7 having the small reflectance and the large transmittance, while the pulse illumination light IL serving as the illumination light for exposure passing through the beam splitter 7 enters the condenser lens 10 through a relay lens 8.

The relay lens 8 has a first relay lens 8A, a second relay lens 8B. A fixed illumination field stop (fixed reticle blind) 9A and movable illumination field stop 9B are arranged between the lenses 8A and 8B. The fixed illumination field stop 9A has a rectangular aperture. The pulse illumination light IL passing through the beam splitter 7 passes through the rectangular aperture of the fixed illumination field stop 9A through the first relay lens 8A. Further, the fixed illumination field stop 9A is arranged near the conjugate surface with the pattern surface of the reticle. The movable illumination field stop 9B has an aperture variable in position and width in the scan direction and is arranged close to the fixed illumination field stop 9A. By further restricting the illumination field through the movable illumination field stop 9B at the start and end of the scan exposure, exposure of unnecessary portions (other than shot areas on wafer to which reticle pattern is to be transferred) is prevented.

As shown in FIG. 4, the pulse illumination light IL passing through the fixed illumination field stop 9A and the variable illumination field stop 9B illuminates the rectangular illumination area 12R on the reticle 11 held on the reticle stage 15 by a uniform illumination distribution through the second relay lens 8B and the condenser lens 10. The image obtained by reducing the pattern in the illumination area 12R on the reticle 11 by the projection magnification α (α being for example ¼, ⅕, etc.) through the projection optical system 13 is projected and exposed on the illumination field 12W on the wafer (photosensitive substrate) 14 coated with a photoresist. Below, the explanation will be given taking the Z-axis parallel to the optical axis AX of the projection optical system 13, using the scan direction of the reticle 11 with respect to the illumination area 12R in the plane perpendicular to the optical axis AX (that is, the direction parallel to the surface of the paper of FIG. 4) as the Y-direction, and using the non-scan direction perpendicular to the scan direction as the X-direction.

At this time, the reticle stage 15 is scanned in the Y-direction by the reticle stage drive 18. The Y-coordinate of the reticle stage 15 measured by an external laser interferometer 16 is supplied to a stage controller 17. The stage controller 17 controls the position and speed of the reticle stage 15 through the reticle stage drive 18 based on the supplied coordinate.

On the other hand, the wafer 14 is placed on the wafer stage 28 through the wafer holder WH. The wafer stage 28 has a Z-tilt stage 19 and an XY-stage 20 on which the Z-tilt stage 19 is placed. The XY-stage 20 positions the wafer 14 in the X-direction and the Y-direction and scans the wafer 14 in the Y-direction. Further, the Z-tilt stage 19 has the function of adjusting the position in the Z-direction of the wafer 14 (focus position) and the inclination angle of the wafer 14 with respect to the XY-plane. The X-coordinate and Y-coordinate of the movable mirror fixed on the Z-tilt stage 19 and the XY-stage 20 (wafer 14) measured by the external laser interferometer 22 are supplied to the stage controller 17. The stage controller 17 controls the position and speed of the XY-stage 20 through the wafer stage drive 23 based on the supplied coordinates.

Further, the operation of the stage controller 17 is controlled by the main control system for overall control of the entire apparatus, not shown. Further, at the time of scan exposure, in synchronization with the reticle 11 being scanned at a speed $V_R$ in the +Y-direction (or −Y-direction) through the reticle stage 15, the wafer 14 is scanned by the speed $\alpha \cdot V_R$ (α being the projection magnification from the reticle 11 with respect to the wafer 14) in the −Y-direction (or +Y-direction) with respect to the illumination field 12W.

Further, an illumination uniformity sensor 21 comprised of a photoconversion element is provided near the wafer 14 on the Z-tilt stage 19. The light receiving surface of the illumination uniformity sensor 21 is set to the same height as the surface of the wafer 14. As the illuminance uniformity sensor 21, use may be made of a PIN type photodiode etc. having sensitivity in the ultraviolet and having a high response frequency for detecting the pulse illumination light. The detection signal of the illuminance uniformity sensor 21 is supplied through a not shown peak hold circuit and analog/digital (A/D) converter to the exposure controller 26.

Note that the pulse illumination light IL reflected at the beam splitter 7 shown in FIG. 4 is received at an integrator sensor 25 comprised of a photoconversion element through a condenser lens 24. The photoelectric conversion signal of the integrator 25 is supplied to the exposure controller 26 as the output DS through the not shown peak hold circuit and the A/D converter. The correlation coefficient between the output DS of the integrator sensor 25 and the illumination (exposure quantity) of the pulse illumination light IL on the surface of the wafer 14 is found using the illuminance meter in advance and stored in the exposure controller 26. The exposure controller 26 supplies the control information TS to the exposure light source 1 so as to control the emission timing and emission power etc. of the exposure light source 1. The exposure controller 26 further controls the attenuation rate at the energy modulator 2b, while the stage controller 17 controls the opening and closing operation of the movable illuminance field stop 9B in synchronization with the operating information of the stage system.

(3) Illuminance Meter

In the present embodiment, in the production line of a semiconductor device using a lithography system comprising a combination of a step-and-scan type projection exposure apparatus 30a using the above KrF excimer laser as the illumination light for exposure and step-and-scan type projection exposure apparatuses 30b to 30d using ArF excimer lasers as illumination light for exposure, use is made of an illuminance measurement apparatus provided with an inter-apparatus illuminance meter 50 and console apparatus 90 of the configurations shown in FIG. 1, FIG. 2, and FIG. 5 for detecting the illuminances of the exposure apparatuses 30a to 30d and matching the exposure quantities among exposure apparatuses.

As shown in FIG. 1, the illuminance meter 50 has a photo sensor (illuminance detector) 52, an illuminance meter circuit 54, an illuminance measurement transceiver (wireless transceiver) 82, a power source circuit 84, a storage cell (battery) 86, and a photoelectric converter 88. The console apparatus 90 has a main transceiver (wireless transceiver) 92 and an input/output device 94.

The photo sensor 52 has a photoconversion element and outputs an electrical signal in accordance with the incident energy of the illumination light for exposure striking on the photo sensor 52. The photoconversion element able to be used in the present embodiment is not particularly limited. A photoconversion element utilizing the photovoltaic effect, Schottkey effect, photoelectromagnetic effect, photoconduction effect, photoelectron emission effect, and pyroelectric effect may be mentioned. In the present embodiment, a broad band photo sensor element able to detect a plurality of illumination light for exposure having different oscillation spectra in a predetermined wavelength range is preferable. This is to detect light of both the wavelengths of the KrF excimer laser and the ArF excimer laser. From this viewpoint, a pyroelectric sensor element, that is, a photoconversion element using the pyroelectric effect, is preferable.

As shown in FIG. 2, the illuminance meter circuit 54 has an amplification circuit (amplifier) 56 which receives the output signal (illuminance signal) from the photo sensor through wiring (patterns) 53. The amplification circuit 56 is connected to an amplification rate storage device 64 and amplifies the illuminance signal from the photo sensor 52 by a certain amplification rate stored in the amplification rate storage device 64.

The amplification rate storage device 64 stores amplification rates preset according to the types of the illumination light for exposure. In the present embodiment, a KrF amplification rate for KrF excimer laser exposure illumination light and an ArF amplification rate for ArF excimer laser exposure illumination light are stored. The method of setting these amplification rates will be explained later.

A peak hold (P/H) circuit 58 is connected to the amplification circuit 56 and holds the peak value of the illumination signal amplified by the amplification circuit 56. This peak hold circuit 58 is connected to an analog/digital conversion (A/D) circuit 60. The peak value (analog signal) of the illumination signal held by the peak hold circuit 58 is converted to a digital signal.

The analog/digital conversion circuit 60 is connected to a calibration circuit 62. The digital signal converted by the analog/digital conversion circuit 60 (illumination signal) is calibrated by the calibration circuit 62. The calibration by the calibration circuit 62 is performed based on a calibration value stored in a calibration value storage device 66 connected to the calibration circuit 62. The calibration value storage device 66 stores calibration values preset in accordance with the types of the illumination light for exposure. In the present embodiment, a KrF calibration value for the KrF excimer laser exposure illumination light and an ArF calibration value for ArF excimer laser exposure illumination light are stored. The method of setting the calibration values will be explained later.

The reason why calibration by the calibration circuit 62 is required will be given below. That is, the digital signal before input to the calibration circuit 62 is a digital signal of an amount corresponding to the illuminance of the light impinging the photo sensor 52, but in order to calculate the illuminance from the digital signal, it is necessary to make corrections considering the amplification rate at the amplification circuit 56 and the wavelength dependency of the sensor element used by the photo sensor 52 etc. If this calibration is not performed, accurate illuminance cannot be calculated and displayed. Note that in the present embodiment, the photo sensor 52 receives two types of exposure illumination light of the KrF excimer laser and the ArF excimer laser, so as the calibration value used in the calibration circuit 62, two types of calibration values, that is, the KrF calibration value for the KrF excimer laser exposure illumination light and ArF calibration value for the ArF excimer laser exposure illumination light, become necessary.

The output end of the calibration circuit 62 has connected to it a storage device 74 for storing and holding the result data. Data calibrated by the calibration circuit 62 and converted to illuminance (incident energy) is stored and held by the result data storage device 74.

The result data stored and held in the result data storage device 74 (data calibrated by calibration circuit 62 and converted to illuminance) is sent to the illuminance meter transceiver 82 and is wirelessly transmitted from an antenna AT by a carrier of a predetermined wavelength (radio wave, infrared ray, etc.) The console transceiver 92 of the console apparatus 90 receives the carrier from the illuminance meter transceiver 82, extracts the result data, and sends it to the input/output device 94. The input/output device 94 has a display device or a controller having an input use keyboard and memory and stores or displays the sent result data. The console apparatus 90 may also be connected to a host computer 76 by a LAN etc. and directly send the result data to the host computer 76.

Note that in this example, the photo sensor 52 and the illuminance meter circuit 54 are configured integrally as an illuminance meter 50, but it is also possible to provide only the photo sensor 52 and the necessary ancillary circuits and illuminance meter transceiver 82 at the illuminance meter 50 side and provide almost all of the illuminance meter circuit 54 (except ancillary circuits) at the console apparatus 90 side.

A switch circuit 68 is connected as necessary to the amplification rate storage device 64 and calibration value storage device 66. The switch circuit 68 outputs a switch signal to the storage devices 64 and 66 and/or the amplification circuit 56 and calibration circuit 62 so as to switch the amplification rate used in the amplification circuit 56 and the calibration value used in the calibration circuit 62 in accordance with the type of the exposure illumination light to be input to the photo sensor 52.

The switch signal from the switch circuit 68 may be generated based on a selection signal input manually from the input/output device 94 and sent through the console transceiver 92, illuminance meter transceiver 82, and wireless line connecting the same to the switch circuit 68 of the illuminance meter circuit 54. A worker selects the type of the exposure illumination light for which the illuminance is to be measured (in this embodiment, a KrF excimer laser or an ArF excimer laser) manually from the input/output device 94. By using the input/output device 94 to select the type of the exposure illumination light (in this embodiment, a KrF excimer laser or ArF excimer laser), a switch signal is output from the switch circuit 68 and the amplification rate used at the amplification circuit 56 and the calibration value used at the calibration circuit 62 are determined and read out from the storage devices 64 and 66. Note that it is also possible to input a selection signal showing the type of the exposure illumination light used in the exposure apparatuses 30a to 30d for measuring the illuminance (in this embodiment, a KrF excimer laser or ArF excimer laser) from the host computer 76.

Next, an explanation will be made of the method of setting the amplification rate to be stored in the amplification rate storage device 64 and the calibration rate to be stored in the calibration value storage device 66 shown in FIG. 2.

In an ArF excimer laser exposure apparatus, the resist used generally is higher in sensitivity compared with the resist used in a KrF excimer laser exposure apparatus. Further, in an ArF excimer laser, which has a poorer energy stability than a KrF excimer laser, the cumulative number of pulses is increased to improve the accuracy of control of the cumulative exposure quantity. Therefore, the energy per pulse becomes smaller compared with a KrF excimer laser exposure apparatus. Typically, there is a difference of several times to 10 times or so the incident energy level of the illuminance meter.

Therefore, in the past, even if using an illuminance meter optimized for a KrF excimer laser exposure apparatus to measure the illuminance of an ArF excimer laser exposure apparatus, there is a high possibility that the output signal of the sensor will fall and a sufficient broad measurement range having linearity will not be obtained.

Further, when the wave used differs, the sensitivity of the sensor changes somewhat, so measurement of the absolute value of the accurate illuminance becomes difficult with a calibration value similar to the case of a KrF excimer laser.

Therefore, in the present embodiment, the amplification rate storage device 64 shown in FIG. 2 stores two types of amplification rates, that is, the KrF amplification rate and the ArF amplification rate, and uses these switched in accordance with the exposure wavelength. Further, the calibration value storage device 66 stores two types of calibration values, that is, the KrF calibration value and ArF calibration value, and uses these switched in accordance with the exposure wavelength.

First, an explanation will be made of the setting of the KrF amplification rate and the ArF amplification rate to be stored in the amplification rate storage device 64.

As shown in FIG. 6, in the peak hold circuit 58, in the relation between the input signal (input voltage) and the output signal (output voltage), when the input voltage V0 is larger than V1 and smaller than VF2, there is a region of a good linearity (proportional relation). In other words, the linearity of measurement by the illuminance meter 50 depends on the trackability of the peak hold circuit 58. Therefore, to calculate the accurate illuminance, it is necessary to set the amplification rate in the amplification circuit 56 so that the output voltage V0 (input voltage to peak hold circuit 58) becomes one of the relation V1<V0<V2.

At that time, since the irradiation energy per pulse in the case of a KrF excimer laser and the irradiation energy per pulse in the case of an ArF excimer laser differ, the KrF amplification rate gKrF and the ArF amplification rate gArF are determined so that the output voltage becomes about V0. The KrF amplification rate gKrF and the ArF amplification rate gArF are stored in the amplification rate storage device 64 shown in FIG. 2. The operation for storage can be performed by manually operating the input/output device 94 shown in FIG. 1.

Note that the irradiation energy per pulse in the case of a KrF excimer laser and the irradiation energy per pulse in the case of an ArF excimer laser may be found by simulation by a computer analysis program and may be found by actual measurement.

Next, an explanation will be given of the setting of the KrF calibration value and the ArF calibration value to be stored in the calibration value storage device 66 shown in FIG. 2.

As one method for finding these calibration values, for example, as shown in FIG. 7, first, the KrF excimer laser apparatus 78 is used to emit light emitted from the same laser apparatus 78 simultaneously to the photo sensor 52a of the KrF reference illuminance meter 50a (having illuminance meter circuit 54a) and the photo sensor 52 of the illuminance meter 50 to be calibrated through the beam splitter 80 with a known reflectance and transmittance. At this time, the amplification rate used at the amplification circuit 56 of the illuminance meter 50 to be calibrated may be set using the switch circuit 68 to the KrF amplification rate. Next, the KrF calibration value is determined using the reflectance and the transmittance of the beam splitter 80 so that the detection value of the illuminance meter 50 to be calibrated becomes the same value as the detection value by the KrF reference illuminance meter 50a. The determined KrF calibration value is stored in the calibration value storage device 66 shown in FIG. 2 in the illuminance meter 50. The KrF calibration value may also be determined and stored manually, but the reference illuminance meter 50a and the illuminance meter 50 to be calibrated may be connected directly or indirectly through another apparatus and this is done automatically.

The ArF calibration value may be determined and stored by the same operation as the above by changing the laser apparatus 78 shown in FIG. 7 to one for an ArF excimer laser, replacing the reference illuminance meter 50a with one for an ArF excimer laser, and setting the amplification rate used in the amplification circuit 56 of the illuminance meter 50 to be calibrated to become the ArF amplification rate using the switch circuit 68.

Next, an explanation will be given of the supply of power for operating the illuminance meter 50 with reference to FIG. 1 to FIG. 5. As shown in FIG. 1, the illuminance meter 50 has a power circuit 84, storage cell 86, and photoelectric converter 88. The photoelectric converter 88 is for example a so-called solar cell using the photoelectric effect. It is a power generator functioning to generate power by irradiation of light (visible light and ultraviolet rays). The power generated by the photoelectric converter 88 is stored in the storage cell 86 through the power supply circuit 84. The power supply circuit 84 supplies power from the storage cell 86 to the photo sensor 52, illuminance meter circuit 54, and illuminance meter transceiver 82.

The light supplied to the photoelectric converter 88 is not particularly limited, but in the present embodiment, as shown in FIG. 5, use is made of the branched light LB2 obtained by branching part of the laser beam LB emitted from the light source 1 from the main light beam LB1 by the beam splitter 98. The branched light LB2 is transmitted to under the wafer stage 28 to illuminate the photoelectric converter 88 of the illuminance meter 50 from below. Note that instead of the beam splitter 98, it is also possible to guide all of the laser beam LB to the photoelectric converter 88 at the time of storing power using a movable full reflection mirror.

At the time of measurement of the illuminance, the illuminance meter 50, as shown in FIG. 5, is attached through a temperature adjuster 96 to a predetermined attachment position (adapter) on the wafer stage 28 (Z-stage 19). Note that the temperature adjuster 96 is a device for cooling the photo sensor 52 and is comprised of for example a Pelche element. In this state, the photoelectric converter 88 is illuminated by the branched light beam LB2 to generate power which is then stored in the storage cell 86.

Next, the wafer stage 28 is controlled to be driven in the X- and Y-directions. The exposure illumination light passing through the projection optical system 13 shown in FIG. 4 is made to impinge the photo sensor 52 of the illuminance meter 50 so as to measure the illuminance of the illumination light at the image plane (or vicinity) of the projection optical system 13.

Note that the light receiving surface of the photo sensor 52 of the illuminance meter 50 is provided near a position directly under the aperture plate. The position of the illuminance meter 50 is adjusted by the Z-tilt stage 19 so that the bottom surface of the aperture plate substantially coincides with the image plane of the projection optical system 13 at the time of measurement of the illuminance.

The data of the measurement results is sent to the console apparatus 90 through the transceiver 82 of the illuminance meter 50 and the transceiver 92 of the console apparatus 90 and is displayed on the display of the input/output device 94 or sent to the host computer 76. Next, the illuminance of the other exposure apparatuses is measured successively in the same way.

According to the present embodiment, the measurement results of the illuminance meter 50 attached to the wafer stage 28 and the instructions etc. for control of the illuminance meter are sent by wireless communication through the illuminance meter transceiver 82 and the console transceiver 92. Therefore, the cable connected in the past for transmitting these signals can be omitted. Further, since all or part of the illumination light is converted photoelectrically and stored in the storage cell 86, the cable for supplying power is also unnecessary. Therefore, it is possible to eliminate the problems arising due to these cables. Note that both the illuminance meter 50 and the console are made able to both transmit and receive, but for example it is also possible to make the illuminance meter 50 only transmit and the console only receive or the reverse. In the latter case, the illuminance information may be stored in the memory in the illuminance meter 50. Further, the storage cell 86 may be a battery or a dry cell etc. Any type may be used. Further, the photoelectric converter 88 having a power generation function need not be provided. Instead, it is possible to change the storage cell 86 or connect the storage cell 86 with an external charger for charging when the wafer stage 28 is at a predetermined location (loading position of wafer etc.)

In the present embodiment, since a single illuminance meter 50 is used to measure the illuminance by switching the amplification rate used at the amplification circuit 56 and the calibration value used at the calibration circuit 62 between those for a KrF excimer laser and ArF excimer laser in accordance with the light source used by the exposure apparatus for which the illuminance is to be measured, it is possible to measure the illuminance of both an KrF excimer laser exposure apparatus and an ArF excimer laser exposure apparatus using a single illuminance meter 50.

The illuminance output signal measured using the illuminance meter 50 may be used for calibration of photo sensors such as the integrator sensors 25 or illumination uniformity sensors 21 etc. attached to the exposure apparatuses or used for matching the amounts of exposure among the exposure apparatuses 30a to 30d.

Further, in the above embodiment, the explanation was given of the example of application of the present invention to an illuminance meter 50 able to be detachably attached to the wafer stage 28, but the present invention may also be applied to an illuminance uniformity sensor 21 as a photodetector. Further, for example, the present invention may also be applied to a sensor used as a photodetector used for measurement of the alignment or the optical characteristics of the projection optical system 13 (magnification, focus position, aberration, etc) and detecting the projected image of a mask pattern formed on a reticle. Further, the present invention may be applied to a sensor used as a photodetector provided at a reticle as a movable member and for example detecting the exosure illumination light IL (first beam). Further, the present invention may be applied to a sensor when providing a sensor as a photodetector at a movable member provided independently from the wafer holder. Further, the sensor used as the photodetector to which the present invention is applied is not limited to detection of the exposure illumination light IL (first beam) and may also be used for detection of illumination light (second light beam) such as alignment light which differs in wavelength or light source etc. from the illumination light IL. The point is that it be a sensor provided at the movable member—regardless of attachability, application, etc.

Note that in the above embodiment, as the illuminance meter 50, the explanation was given of one which could measure the illuminance by switching between two modes, that is, one for a KrF excimer laser and an ArF excimer laser, but of course it may also be a type which does not allow switching. Further, the combination of the two types of wavelengths is not limited to the above. Another combination of wavelengths can also be used. Further, the combination of different wavelengths may be a combination of only two or of three or more. Further, even if the wavelength is the same, it is also possible to switch in the incident energy range to detect the illuminance of exposure illumination light having different ranges of incident energy by a high accuracy.

Further, the circuits and the devices making up the illuminance meter circuit 54 shown in FIG. 2 may be configured by only electrical circuits (hardware) for realizing their functions, but it is also possible to realize all or part by a microcomputer and software program.

Further, as the illuminance meter 50, it is also possible to configure the meter as a wafer to make a dummy wafer, transport it in the same way as a wafer to be processed, and load and unload it to and from a wafer stage 28. In this case as well, the result data of the illuminance meter 50 is sent to the console apparatus 90 by wireless communication.

[Second Embodiment]

Figure 8:
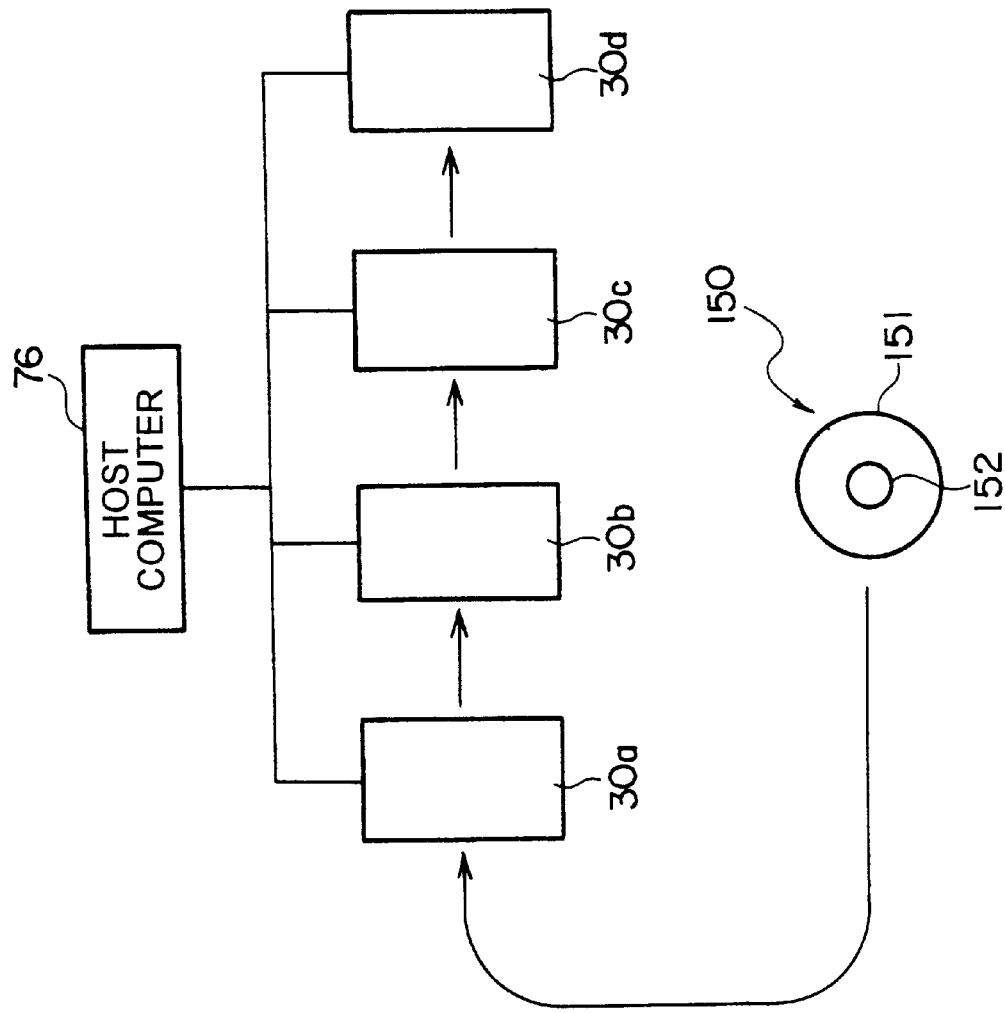
FIG. 8 is a schematic view of the configuration of a lithography system according to a second embodiment of the present invention.
Figure 9:
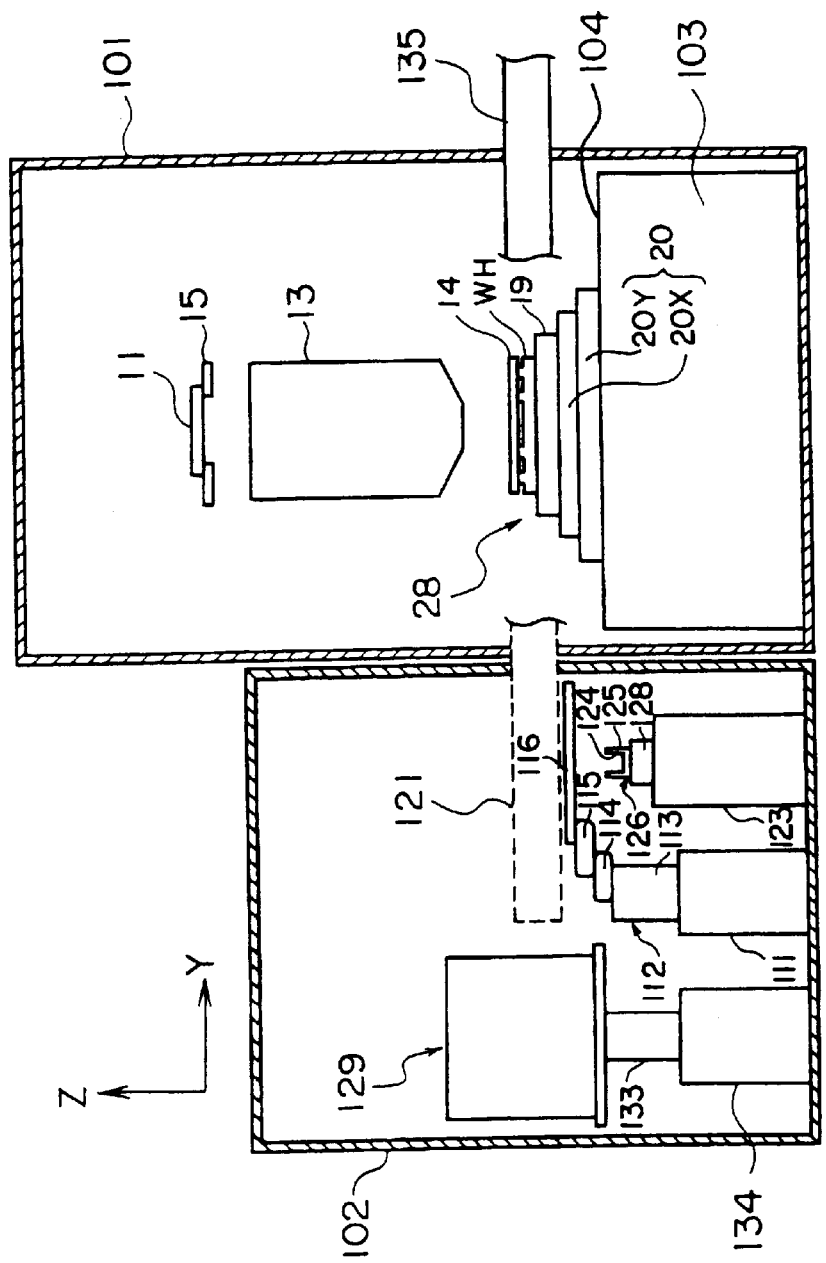
FIG. 9 is a longitudinal sectional view of the basics of the overall configuration of an exposure apparatus according to the second embodiment of the present invention.
Figure 10:
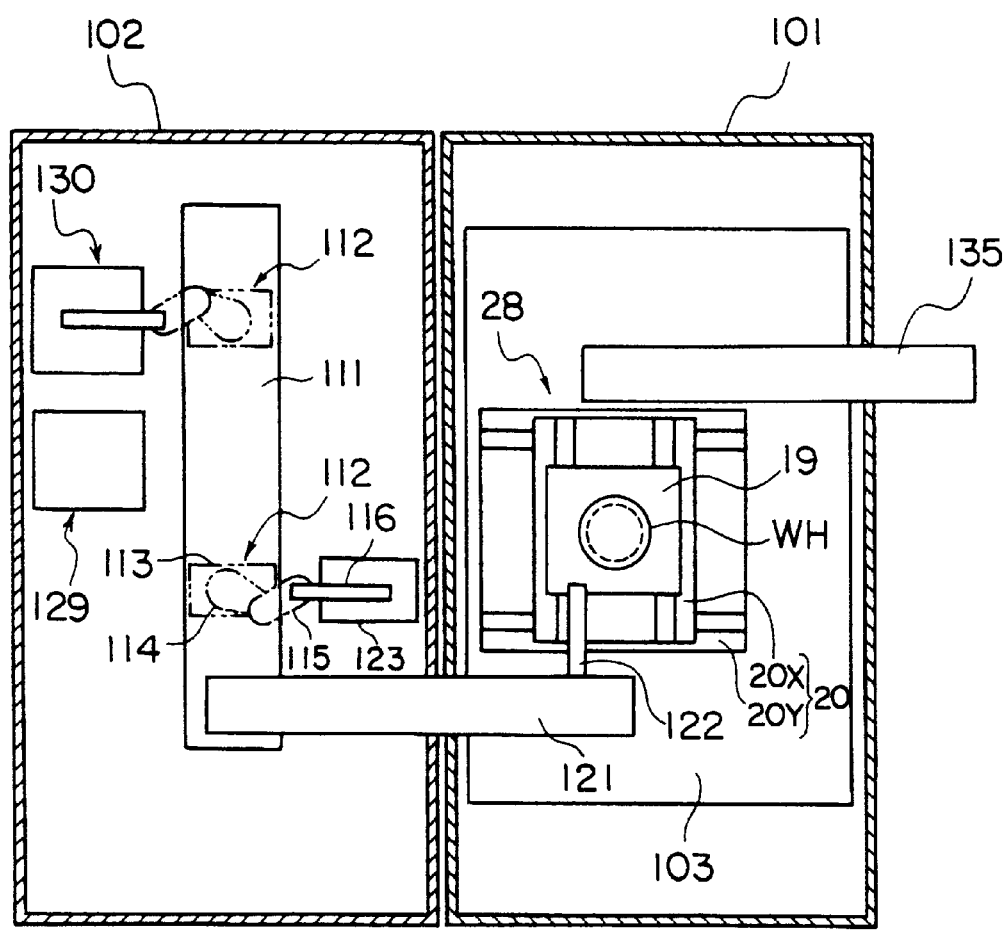
FIG. 10 is a lateral sectional view of the basics of the overall configuration of the exposure apparatus according to the second embodiment of the present invention.
Figure 11:
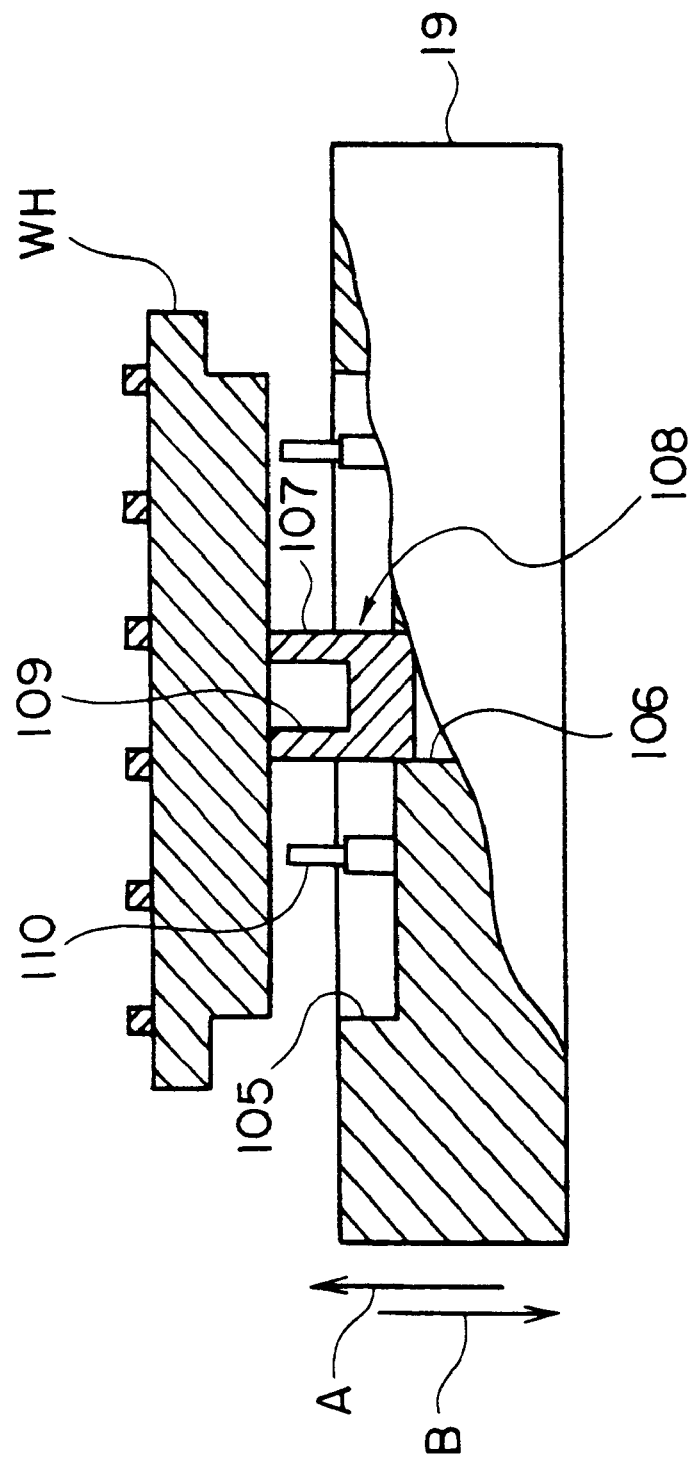
FIG. 11 is a partially cutaway view of a wafer holder and a wafer stage of the second embodiment of the present invention.
Figure 12:
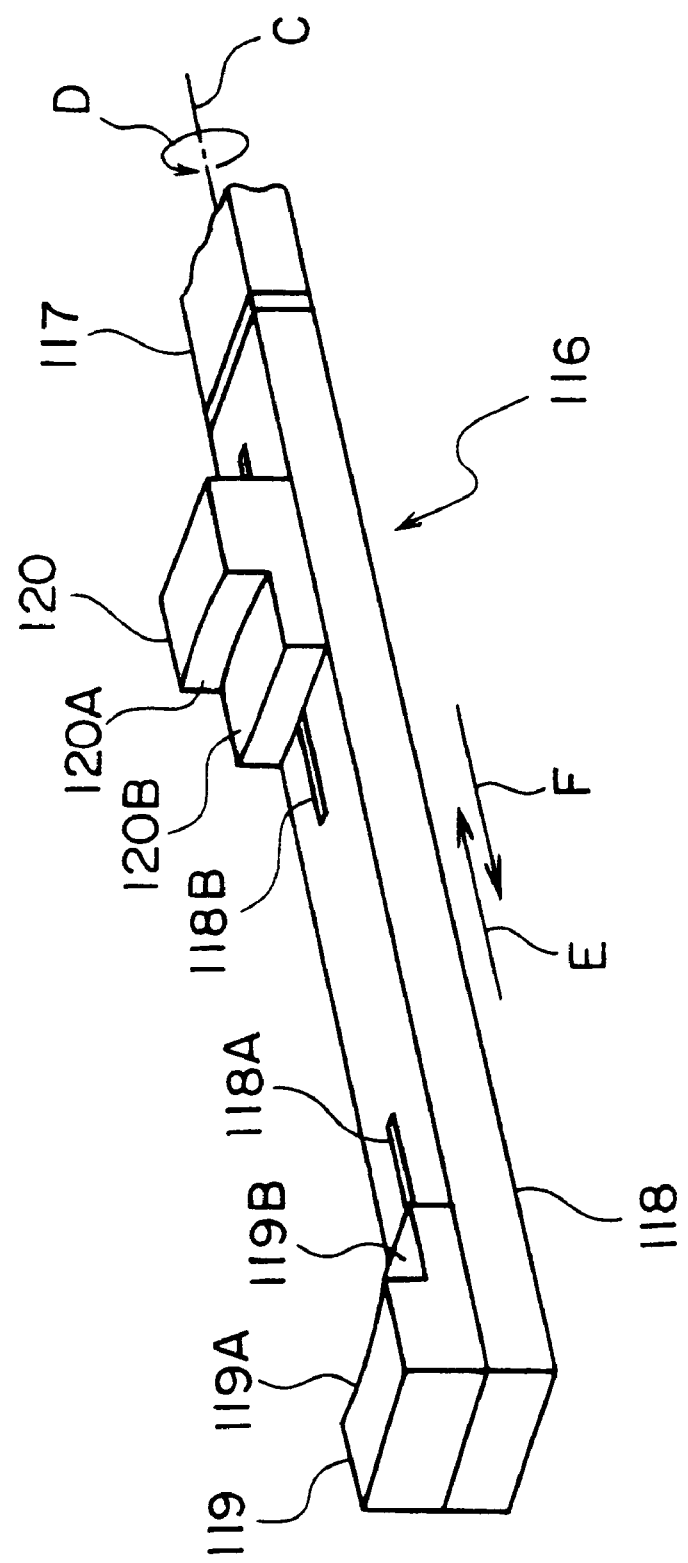
FIG. 12 is a perspective view of the basics of the configuration of a hand portion of a robot hand of a transport system for a wafer holder according to the second embodiment of the present invention.
Figure 13:
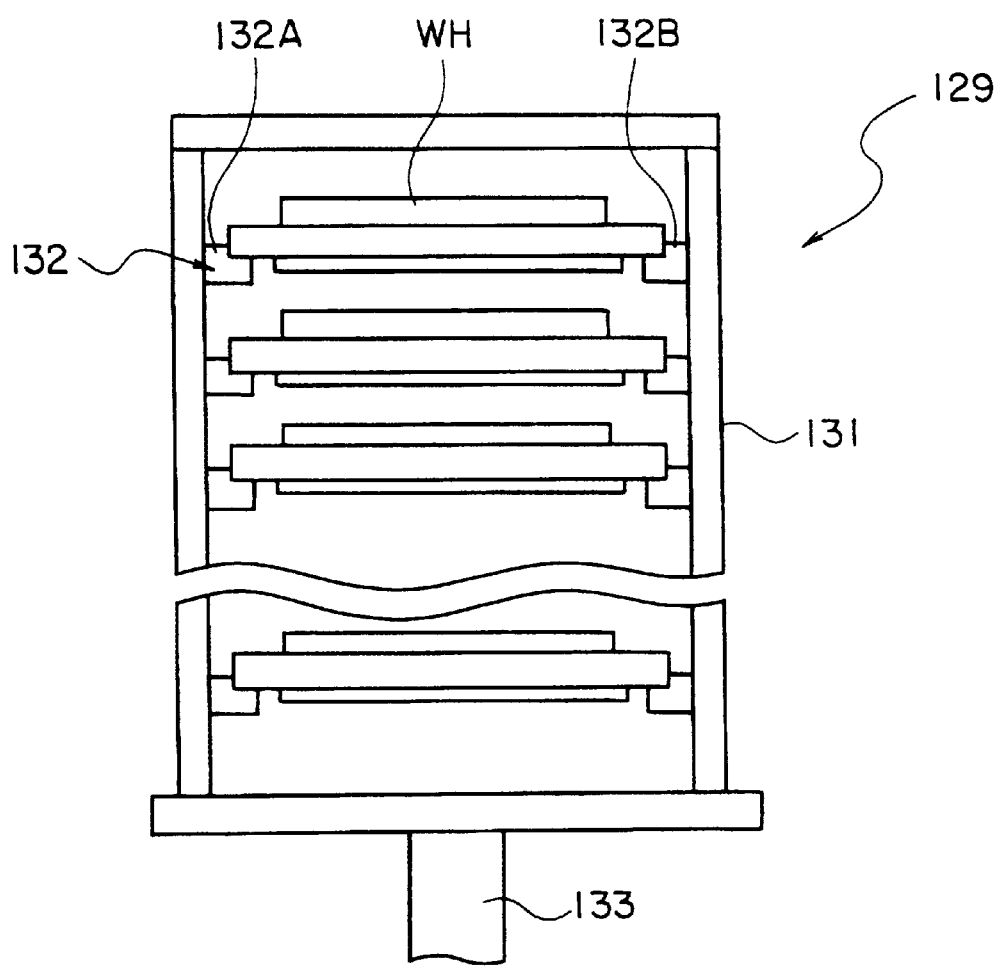
FIG. 13 is a view of the configuration of a holder storage unit according to the second embodiment of the present invention.
Figure 14:
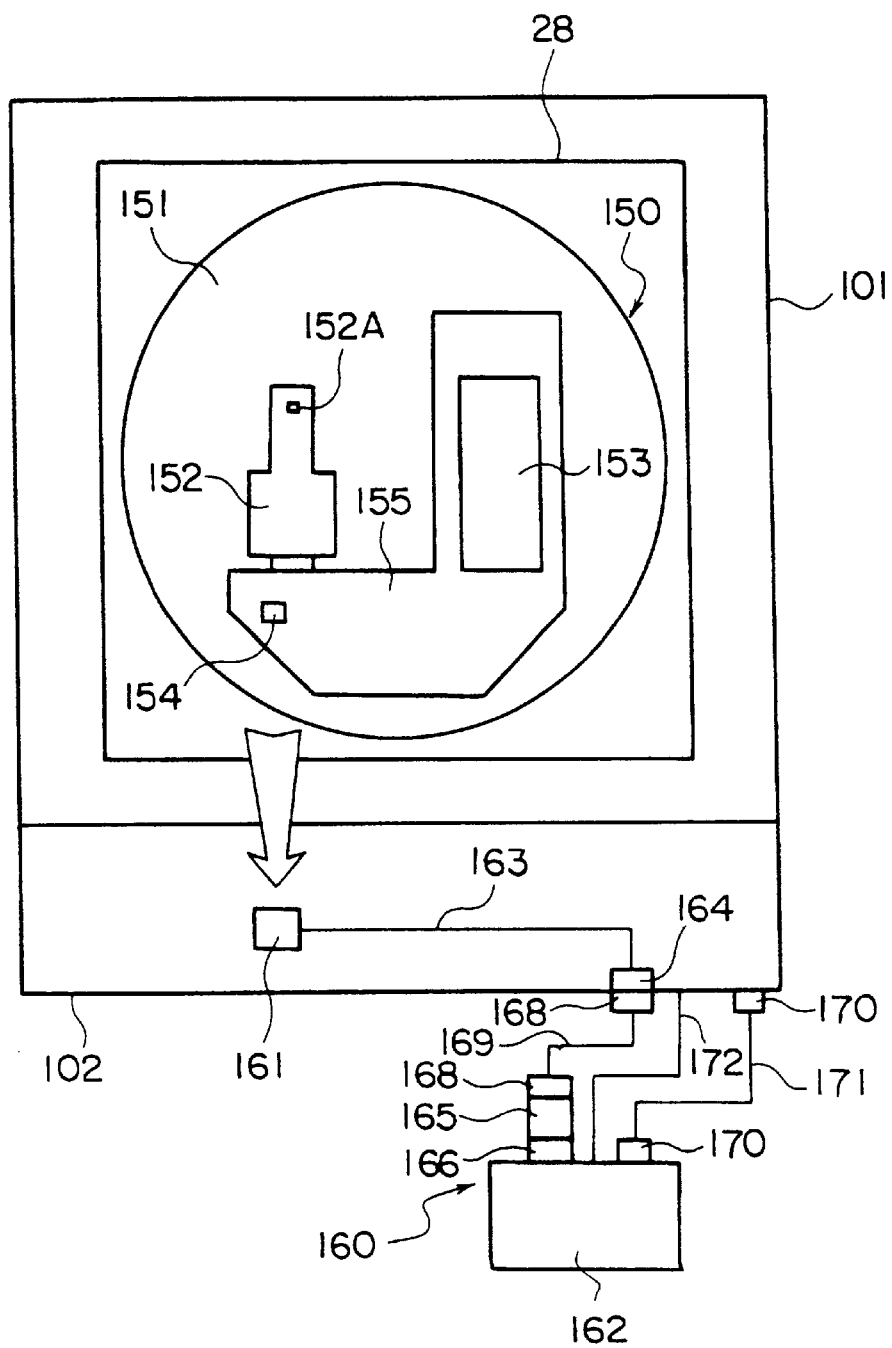
FIG. 14 is a view of the configuration of an illuminance measurement apparatus including a holder type illuminance meter according to the second embodiment of the present invention.
Figure 15:
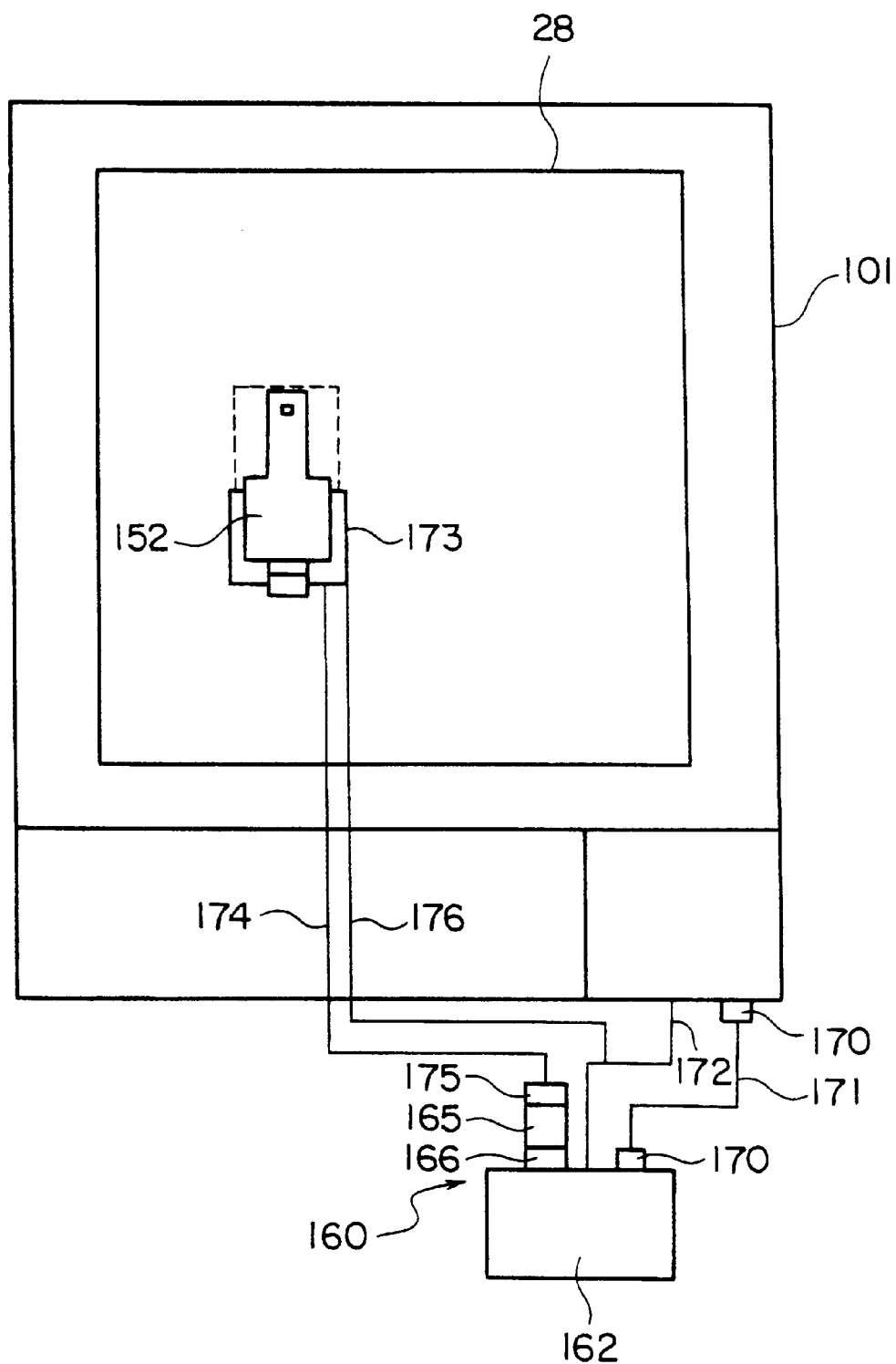
FIG. 15 is a view of the configuration when directly attaching the probe according to the second embodiment of the present invention to the wafer stage without using a dummy holder.

FIG. 8 to FIG. 15 are views for explaining a second embodiment of the present invention, wherein FIG. 8 is a schematic view of the configuration of a lithography system according to a second embodiment of the present invention; FIG. 9 is a longitudinal sectional view of the basics of the overall configuration of an exposure apparatus according to the second embodiment of the present invention; FIG. 10 is a lateral sectional view of the basics of the overall configuration of the exposure apparatus according to the second embodiment of the present invention; FIG. 11 is a partially cutaway view of a wafer holder and a wafer stage of the second embodiment of the present invention; FIG. 12 is a perspective view of the basics of the configuration of a hand part of a robot hand of a transport system for a wafer holder according to the second embodiment of the present invention; FIG. 13 is a view of the configuration of a holder storage unit according to the second embodiment of the present invention; FIG. 14 is a view of the configuration of an illuminance measurement apparatus including a holder type illuminance meter according to the second embodiment of the present invention; and FIG. 15 is a view of the configuration when directly attaching the probe according to the second embodiment of the present invention to the wafer stage without using a dummy holder. Portions substantially the same as in the first embodiment explained above are given the same reference numerals and parts of the explanations thereof are omitted.

(1) Lithography System

The lithography system of the second embodiment, in the same way as the lithography system of the first embodiment explained above, is one for producing a semiconductor device as the microdevice. As shown in FIG. 8, it is comprised of a combination of an exposure apparatus 30a using a KrF excimer laser as an exposure illumination light source and exposure apparatuses 30b to 30d using an ArF excimer laser as an exposure illumination light source. These two types of exposure apparatuses 30a to 30d are connected to the same host computer 76 which monitors their operating states etc. and controls production. The illuminances of these exposure apparatuses 30a to 30d are measured by a holder type illuminance meter 150 serving as an inter-apparatus illuminance meter and are used for matching the exposure quantities among the exposure apparatuses.

The exposure apparatuses 30a to 30d of the second embodiment are provided with transport systems for automatically transporting wafer holders holding the wafers. Wafer holders sometimes become dirty due to use, so are retrieved and cleaned every certain interval or according to need and clean wafer holders supplied. The automatic transport systems of wafer holders are provided to streamline this work.

In this embodiment, by providing a probe for measurement of the illuminance at a dummy holder having external interchangeability with a wafer holder and enabling use of the transport system of the wafer holder, the measurement of the illuminance at the exposure apparatuses is streamlined. Note that in this embodiment, the explanation was made of a system comprised of a combination of two types of exposure apparatuses with different light sources, but it may also be applied to a system comprised of a plurality of exposure apparatuses of the same type or exposure apparatuses of a greater number of types.

(2) Optical System of Exposure Apparatus

The optical system of the exposure apparatus of the second embodiment is similar to that explained with reference to FIG. 4 in the first embodiment, so an explanation thereof will be omitted.

(3) Automatic Transport System of Wafer Holder

An automatic transport system of a wafer holder will be explained with reference to FIG. 9 and FIG. 10. This transport system is an apparatus which loads a clean wafer holder WH on the wafer stage 28 and unloads a dirty wafer holder WH from the wafer stage 28 for recovery.

An optical system including a reticle stage 15, a projection optical system 13, the wafer stage 28, etc. is housed in a chamber (environment chamber) 101 for providing a clean and temperature-controlled environment. A chamber (loader chamber) 102 in which the main parts of the holder transport system are housed is provided adjoining the environment chamber 101. The two chambers 101 and 102 are made independent in this way so as to prevent dust from entering the chambers 101 and 102. In particular, it is necessary to strictly control the temperature or humidity inside the environment chamber 101. The inside of the chamber 101 is controlled to within ±0.1° C. of the set temperature, for example, 20° C., at all times. The chambers 101 and 102 are provided with the minimum number of doors necessary for the manufacture of the semiconductor device and maintenance.

The wafer stage 28 provided on a base 104 fixed on a counter 103 is configured by an XY-stage 20 (X-stage 20X and Y-stage 20Y) and a Z-stage 19 placed on the same as already explained. A disk-shaped wafer holder WH with a step difference serving as a substrate holder is held by suction on the Z-stage 19 through a vacuum chuck (not shown) serving as a vacuum suction means. A wafer 14 to be exposed is therefore held by suction on the wafer holder WH.

FIG. 11 shows the Z-stage 19 partially cut away along with the wafer holder WH. As shown in FIG. 11, the Z-stage 19 is formed with a circular hole 105 into which the small diameter part of the bottom of the wafer holder WH can fit. A circular guide hole 106 is formed in the vertical direction at the center of the inside bottom of the circular hole 105. Inside the guide hole 106, a holder support member 107 is inserted to be able to move in the vertical direction along the guide hole 106 as shown by the arrows A and B. The holder support member 107 is designed to be moved vertically by a not shown drive mechanism. That is, in the present embodiment, a holder elevation mechanism 108 serving as a mechanism for attachment of the wafer holder WH is configured by the guide hole 106, holder support member 107, and a not shown drive mechanism.

A substantially U-sectional shaped cutaway part 109 is formed at the top end of the holder support member 107. Due to this, the front end of the holder transport arm explained later can be inserted from one end in the X-axial direction to the other end (from front to rear in direction perpendicular to paper surface in FIG. 11) through this cutaway part 109 at the time of exchange of the wafer holder WH.

Further, three elevating pins 110 comprising a wafer elevation mechanism for three-point support and elevation of the wafer 14 at the time of wafer exchange are provided in the vertical direction on the inside bottom of the circular hole 105. These elevating pins 110 are designed to move up and down with their front ends passing through the wafer holder WH through not shown circular holes provided corresponding to these elevating pins 110 in the state where the wafer holder WH is fixed by suction on the Z-stage 19. Note that the wafer holder WH may be one provided with a plurality of annular ridges concentrically, but in this example it is made a so-called pin chuck holder provided with a large number of pin-shaped projections. The wafer 14 is placed on these large number of projections.

Inside the loader chamber 102, as shown in FIG. 9 and FIG. 10, an X-guide 111 extending in the X-direction is arranged at the center. A robot hand 112 able to move reciprocally in the X-direction is provided on the X-guide 111. The robot hand 112 is comprised of a moving member 113 able to move along the X-guide 111 in the X-direction, a first swivel arm 114 attached on the moving member to be able to turn about a not shown axis of rotation of the base part, a second swivel arm 115 attached to the front end of the first swivel arm 114 (swivel end) be able to turn at its base part, and a hand part 116 attached to the front end (swivel end) of the second swivel arm 115.

That is, the first swivel arm 114 and the second swivel arm 115 of the robot hand 112 can turn integrally about the axis of rotation of the first swivel arm 114 and can extend and retract. Therefore, the hand part 116 attached to the front end of the second swivel arm 115 is designed to be able to freely move within a circular region of a predetermined radius about the axis of rotation of the first swivel arm 114.

FIG. 12 shows the area near the front end of the hand part 116 enlarged. As shown in FIG. 12, the hand part 116 has an attachment part 117 and a front end 118. The front end 118 is configured to be able to turn with respect to the mounting part 117 180 degrees in the arrow D direction and the opposite direction about an axis C extending in the longitudinal direction of the hand part 116. Due to this, when the later mentioned pair of holder grips 119 and 120 grip a wafer holder WH, it is possible to turn the wafer holder WH upside down while gripping the wafer holder WH.

The front end 118 is provided with the facing pair of holder grips 119 and 120 comprised of L-sectional shaped members for gripping the side surfaces of the wafer holder WH. The gripping surfaces 119A and 120A, comprised of top facing surfaces in FIG. 12, of the holder grips 119 and 120 are formed as arc-shaped curved surfaces. Further, not shown vacuum holes are formed at the contact surfaces 119B and 120B of the holder grips 119 and 120 with the back surface of the wafer holder WH. The wafer holder WH is fixed by suction by a not shown vacuum suction means through these vacuum holes.

Further, these holder grips 119 and 120 are configured to be able to move in a direction approaching or moving away from each other as shown by the arrows E and F along guide grooves 118A and 118B. They are configured to be movable in this way so as to grip a plurality of types of wafer holders WH. Therefore, when using only a single type of wafer holder WH, the holder grips 119 and 120 may also be provided fixed to the front end 118 so that the two are positioned separated from each other by exactly a distance by which the distance between the gripping faces 119A and 120A becomes substantially the same as the outer diameter of the large diameter part of the wafer holder WH.

Again refer to FIG. 9 and FIG. 10. A Y-guide 121 extending in the Y-direction is provided passing through the chamber 101 and the chamber 102. The Y-guide 121 has attached to it a holder transport arm (hereinafter suitably called a "transport arm") 122 configured to be able to move along the Y-guide 121 between the chamber 101 and the chamber 102 and able to move a predetermined distance in the X-direction. The holder transport arm 122 is structured similar to the hand part 116 of the above-mentioned robot hand 112 (see FIG. 12).

Note that at the side walls of the two chambers 101 and 102 at the sides where the chamber 101 and the chamber 102 contact each other are formed openings of a size corresponding to the Y-guide 121 and the holder transport arm 122.

Further, a transfer table 123 for transfer of a wafer holder WH between the holder transport arm 122 and the robot hand 112 is arranged near the position where the X-guide 111 and the Y-guide 121 in the chamber 102 intersect. This transfer table 123 is provided with a holder elevation and rotation mechanism 126 having a holder holding member 125 formed with a U-sectional shape cutaway part 124 at its top end in the same way as the holder elevation mechanism 108 on the Z-stage 19.

The holder elevation and rotation mechanism 126 has a cylindrical guide 128 with part of the top end exposed upward from the transfer table 123 and the holder holding member 125 sliding in the vertical direction inside the cylindrical guide 128. The holder holding member 125 is designed to be able to rotate in the range of 90 degrees about the axis of rotation of the Z-direction from the position shown in FIG. 9. Due to this, it becomes possible to transfer a wafer holder WH from the holder transport arm 122 to the robot hand 112.

Further, in the present embodiment, as shown in FIG. 10, a holder magazine 129 for storing wafer holders WH and a holder cleaner 130 are provided at the side opposite to the chamber 101 of the X-guide 111 inside the chamber 102. By moving the robot hand 112 in front of the holder magazine 129 or in front of the holder cleaner 130, it becomes possible to transfer the wafer holders WH. While a detailed explanation is omitted, the holder cleaner 130 is provided with an ultrasonic cleaner for cleaning used, dirty wafer holders WH. Note that the holder cleaner 130 need not necessarily be provided.

The holder magazine 129, as shown in FIG. 13, is for storing clean wafer holders WH (sometimes used and dirty wafer holders WH) and is provided with a box-shaped external case 131 and a plurality of holder shelves arranged at predetermined intervals in the vertical direction at the inside of the two sides walls of the external case 131. The holder shelves 132 are comprised of pairs of left and right L-sectional shaped shelf members 132A and 132B extending toward a direction perpendicular to the paper surface in FIG. 13 (Y-direction).

The holder magazine 132 is supported by a support column 133. The support column 133 is able to move vertically through a not shown vertical direction sliding guide provided inside a base 134 shown in FIG. 9 and is moved vertically by a drive mechanism (not shown) housed in the base 134. Due to this, it is possible to adjust the positional relationship in the height direction between a desired holder shelf 132 in the holder magazine 129 and the hand part 116 of the robot hand 112.

Note that in FIG. 9 and FIG. 10, reference numeral 135 shows a transport system for a wafer 14. The transport system of the wafer 14 is substantially the same as the transport system of the wafer holder WH except that the robot hand 112 etc. of the transport system of the wafer holder WH are optimized for the wafer 14 being transported, so explanations thereof are omitted.

(4) Configuration of Illuminance Measurement Apparatus Provided With Holder Type Illuminance Meter In this embodiment, in a production line of a semiconductor device using a lithography system comprising a combination of a step-and-scan type projection exposure apparatus 30a using the above KrF excimer laser as the illumination light for exposure and step-and-scan type projection exposure apparatuses 30b to 30d using ArF excimer lasers as illumination light for exposure, use is made of an illuminance measurement apparatus provided with a holder type illuminance meter 150 and console apparatus 160 such as shown in FIG. 14 for detecting the illuminances of the exposure apparatuses 30a to 30d and matching the exposure quantities among exposure apparatuses.

The holder type illuminance meter 15 of this embodiment is configured by a dummy holder 151 provided with a probe 152 having a photo sensor similar to the above photo sensor 52, a battery pack 153, an LED (light emitting diode) 154 for transmission of information emitting infrared light, and a holder circuit 155.

The dummy holder 151 has a portion mechanically engaging with the holder holding parts of at least the transport system of the wafer holders WH and the Z-stage 19 (see FIG. 11) shaped substantially the same as the wafer holder WH and is configured to be able to be handled interchangeably with a wafer holder WH. The dummy holder 151 is not provided with the function of a wafer holder in this embodiment, but may also be given the function of a wafer holder WH (function of holding a wafer 14 by suction etc.)

The dummy holder 151 is provided with a probe mount for detachably attaching the probe 152. The probe 152 having the photo sensor is attached in accordance with need to the probe mount. For the probe mount, in this embodiment, a hermetic connector having a high airtightness is used. The probe 152 is mechanically fixed to the dummy wafer 151 and electrically connected to the holder circuit 155 by being attached to the probe mount.

The probe 152 provides a photo sensor comprised of a photoelectric conversion element and outputs an electrical signal in accordance with the incident energy of the exposure illumination light impinging on the photo sensor through a receiving window 152A formed in the probe 152. The photoconversion element able to be used in this embodiment is not particularly limited, but a photoconversion element utilizing the photovoltaic effect, Schottkey effect, photoelectromagnetic effect, photoconduction effect, photoelectron emission effect, and pyroelectric effect may be mentioned.

In the present embodiment, in a system combining exposure apparatuses using KrF excimer lasers as light sources and exposure apparatuses using ArF excimer lasers as light sources, to measure the illuminance, two types of probes are prepared, that is, a KrF probe having a photo sensor able to detect the wavelength of the KrF excimer laser and an ArF probe having a photo sensor able to detect the wavelength of the ArF excimer laser.

Further, the dummy holder 151 is provided with a battery mount for detachably attaching a battery pack 153. The charged battery pack 153 is attached to the battery mount. The battery pack 153 is mechanically fixed to the dummy holder 151 and electrically connected to the holder circuit 155 by being attached to the battery mount. The battery pack 153 is designed to be removed from the dummy holder 151 and charged by using a special charger (not shown).

The LED 154 is driven by a transmission circuit included in the holder circuit 155 and emits infrared rays for wirelessly transmitting the measurement results obtained by the probe 152. The holder circuit 155 is configured by a power circuit for supplying power from the battery pack 154 to the probe 152 or the LED 154 or its drive circuit and other necessary circuits in addition to the transmission circuit.

Here, the charging function corresponding to the photoelectric converter 88 in the first embodiment explained above is not provided in the second embodiment, but it may also be provided on the dummy holder 151 in the same way as the first embodiment. Further, in the second embodiment, since an infrared LED 154 is used as the transmitter for information, the antenna AT such as in the first embodiment is unnecessary, so is not provided. Further, the circuit corresponding to the illuminance meter circuit 54 (see FIG. 2) in the first embodiment is provided at the console apparatus 160, so is not provided at the holder type illuminance meter 150. The circuit corresponding to the illuminance meter circuit 54 may also be included in the holder circuit 155 rather than at the console apparatus 160.

On the other hand, the console apparatus 160 is provided with an infrared receiver (IR receiver) 161, a console unit 162, etc. The infrared receiver 161 is a device receiving the infrared rays emitted by an LED 154 of the holder type illuminance meter 150. In this embodiment, it is provided in the loader chamber 102. The infrared receiver 161 is connected to a connector 164 provided at the loader chamber 102 through a connection cable 163. The console unit 162 is provided with a connector 166 for connecting the probe key 165. The probe key 165 and the connector 164 connected to the infrared receiver 161 are connected through a connection cable 169 having connectors 168, 168 at its two ends.

The probe key 165 has a flash memory etc. The flash memory stores data unique to the probe 152 in advance. In this embodiment, there are two types of probes 152, that is, for KrF and ArF, so two types of probe keys 165 are also provided correspondingly. When changing probes 152, the probe keys 165 are also changed to ones corresponding to them.

The flash memory of the KrF probe key 165 stores and holds the data corresponding to the KrF excimer laser in the data stored in the calibration value storage device 66 or amplification rate storage device 64 of the above first embodiment (see FIG. 2), while the flash memory of the ArF probe key 165 stores and holds ArF data.

The console unit 162 is configured including circuits corresponding to the amplification circuit 56, the peak hold circuit 58, the analog/digital conversion circuit 60, the calibration circuit 62, and the result data storage device 74 in the illuminance meter circuit 54 of the above first embodiment (see FIG. 2).

The console unit 162 is connected with the control system of the exposure apparatus provided at the loader chamber 102 through an interface cable 171 having connectors 170, 170 at the two ends. Reference numeral 172 is a power cable.

When measuring the illuminance, the holder type illuminance meter 150 is accommodated in the holder magazine 129 of the exposure apparatus for which the illuminance is to be measured in the same way as a wafer holder WH, is transported by the automatic transport system of the wafer holder WH in the same way as a usual wafer holder WF, and is held by vacuum suction on the wafer stage 28.

That is, the holder type illuminance meter 150 is accommodated at a predetermined holder shelf 132 of the holder magazine 129 in the same way as a wafer holder WH. At this time, a probe 152 and probe key 165 corresponding to the light source of the exposure apparatus to be measured are attached. The holder type illuminance meter 150 is taken out by the robot hand 112, moved along the X-guide 111, then held by the holder holding member 125 of the transfer table 123. Next, it is moved by the holder transport arm 122 along the Y-guide 121, is transferred to the holder holding part of the Z-stage 19 set at a predetermined exchange position by the XY-stage 20, and held by suction by a vacuum chuck serving as the vacuum suction means. Note that in this embodiment, when the vacuum chuck holds the holder type illuminance meter 150 by suction, the surrounding gas is also sucked in. The out gas from the holder type illuminance meter 150 and its vicinity is drawn out to reduce the measurement error due to the effect of light absorbing substances at the time of measurement of the illuminance.

Next, the holder type illuminance meter 150 is set by the wafer stage 28 to the irradiation position of the illumination light of the projection optical system 13. The illumination light passing through the projection optical system 13 is made to strike the photo sensor of the probe 152 of the holder type illuminance meter 150 to measure the illuminance at the image plane of the projection optical system 13 (or its vicinity). Note that the light receiving surface of the photo sensor provided at the probe 152 is provided near a position directly under the aperture plate having the light receiving window 152A. The position of the holder type illuminance meter 150 is adjusted by the Z-stage 19 so that the bottom surface of the aperture plate, that is, the light receiving surface of the photo sensor, substantially coincides with the image plane of the projection optical system 13. The measurement value is wirelessly transmitted superposed on the infrared ray by driving the LED 154 at the same time as with the measurement.

After the illuminance finishes being measured, the automatic transport system of the wafer holder WH receives the holder type illuminance meter 150 from the wafer stage 28, transports it in the same way as a usual wafer holder WH, and returns it to the holder magazine 129 or places it on another special table.

The infrared receiver 161 receives the infrared ray from the LED 154. The received signal is sent to the console unit 162, subjected to predetermined processing by the console unit 162, then output as the measurement results of the illuminance measurement apparatus. The measurement results are sent to the control system of the exposure apparatus through the interface cable 171 and transferred to the host computer 76 managing the system as a whole connected to the control system through a LAN.

Note that in the above second embodiment, the explanation was given of an exposure apparatus provided with an automatic transport system of wafer holders WH, but if one using a stage of a type enabling exchange of wafer holders WH, even if not provided with a transport system of wafer holders WH, it is possible to measure the illuminance by manually exchanging the wafer holder WH on the stage with the holder type illuminance meter 150.

In the illuminance measurement apparatus of the second embodiment, the probe 152 is designed to be detachably attached to the dummy holder 151, so even when there are exposure apparatuses of a type where exchange of wafer holders WH is not possible in the system, as shown in FIG. 15, by directly attaching the probe 152 to the probe mount 173 on the wafer stage 28, it is possible to measure the illuminance using the illuminance measurement apparatus. The probe mount 173 is connected to a probe key 165 through an interface cable 174 and connector 175. Further, a branching cable 176 of the power cable 172 is connected to the probe mount 173. The probe mount 173 has interchangeability with the probe mount of the dummy holder 151.

Note that in this embodiment, there were exposure apparatuses 30b to 30d with the same type of light sources, so if the holder type illuminance meter 150 is made to be automatically moved among the exposure apparatuses 30b to 30d and the measurement of the illuminance of the plurality of the exposure apparatuses is made to be completely automatically performed using a single holder type illuminance meter 150, the efficiency becomes further higher.

In the above second embodiment, an ArF probe 152 and KrF probe 152 were prepared and suitably attached to a dummy holder 151 configured to be able to be used in common (here, meaning one comprised of the holder type illuminance meter minus the probe), but in the same way as the first embodiment, it is also possible to use a probe able to be used for both ArF and KrF. In this case, it is not necessarily required that the probes be detachable, but detachability is desirable from the viewpoint of maintenance and possibility of use as shown in FIG. 15.

According to the present embodiment, a holder type illuminance meter 150 is designed using a dummy holder 151 designed to be interchangeable with the wafer holder WH and the measurement value is wirelessly transmitted to the console unit 162. No cable for signal transmission or cable for power supply is connected to the holder type illuminance meter 150 at all. Therefore, it is possible to eliminate problems arising due to these cables. Further, since it is possible to automatically load and unload the illuminance meter to and from the wafer stage 28 using the transport system of wafer holders WH, it is possible to measure the illuminance extremely highly efficiently compared with attachment by manual work as in the past.

In the above second embodiment, the signal was sent in one direction from the holder type illuminance meter 150 to the console apparatus 160, but it is also possible to enable transmission of a signal from the console apparatus 160 to the holder type illuminance meter 150 and control the holder type illuminance meter 150 from the console apparatus 160. In this case, it is also possible to provide a storage device at the holder type illuminance meter 150 side and transfer the measurement results in response to requests from the console apparatus 160.

Note that the first embodiment and second embodiment explained above (hereinafter referred to as the "embodiments") were described for facilitating understanding of the present invention, but the descriptions were not given to limit the invention. Therefore, the elements disclosed in the above embodiments include all design modifications or equivalents falling under the technical scope of the present invention.

In the above embodiments, the explanation was made of a step-and-repeat type reduction projection scan exposure apparatus (scanning stepper), but the invention may be similarly applied to a step-and-repeat type reduction projection exposure apparatus (stepper) emitting the illumination light for exposure on the entire surface of the reticle pattern in the state with the reticle and wafer held stationary and block exposing one sectional area (shot area) on the wafer to which the reticle pattern is to be transferred and an exposure apparatus of the step-and-stitch type, the mirror projection type, and proximity type.

In the above embodiments, the illumination light for exposure was made KrF excimer laser light of a wavelength of 248 nm and ArF excimer laser light of a wavelength of 193 nm, but it is also possible to use other light, for example, g-rays and i-rays, $F_2$ laser light (wavelength 157 nm), $Ar_2$ laser light (wavelength 126 nm), etc. In a scan exposure apparatus using an $F_2$ laser as a light source, for example, the refraction optical members used for the illumination optical system or the projection optical system (lens elements) are all made of fluorite, the air in the laser light source, illumination optical system, and projection optical system is for example replaced by helium gas, and the space between the illumination optical system and projection optical system and the space between the projection optical system and the substrate are filled with helium gas.

Further, in an exposure apparatus using an $F_2$ laser, the reticle used is one made of fluorite, fluorine-doped silica glass, magnesium fluoride, LiF, $LaF_3$, lithium-calcium-aluminum fluoride (LiCaAlF crystal), or rock crystal.

Further, instead of an excimer laser, it is also possible to use a harmonic of a YAG laser or other solid laser having an oscillation spectrum at any of a wavelength of 248 nm, 193 nm, and 157 nm.

Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used. Further, it is also possible to use light of a soft X-ray region emitted from a laser plasma light source or SOR, for example, EUV (extreme ultraviolet) light of a wavelength of 13.4 nm or 11.5 nm.

The projection optical system is not limited to a reduction system and may also be an equal magnification system or an enlargement system (for example, an exposure apparatus for producing a liquid crystal display or plasma display). Further, the projection optical system may be any of a reflection system, a refraction system, and a catadioptric system.

The invention may also be applied to a reduction projection type scan exposure apparatus using as a light source a SOR generating EUV (extreme ultra violet) light having an oscillation spectrum in the soft X-ray region or a laser plasma light source etc. or a proximity type X-ray scan exposure apparatus. Further, it may be applied to an exposure apparatus using an electron beam, ion beam, or other charged particle beam.

Further, the present invention may also be applied to apparatuses other than an exposure apparatus used for the production of a semiconductor device, such as an exposure apparatus transferring a device pattern on a glass plate used for the production of a display including liquid crystal display elements, an exposure apparatus transferring a device pattern on a ceramic wafer used for production of a thin film magnetic head, an exposure apparatus used for production of a pickup element (CCD), a micromachine, DNA chip, etc., and the like.

The exposure apparatus of the present embodiment may be produced by assembling an illumination optical system comprised of a plurality of lenses and a projection optical system into the body of the exposure apparatus and optically adjusting them, attaching the reticle stage or substrate stage comprised of the large number of mechanical parts to the exposure apparatus body and connecting the wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of the above embodiment based on the design step, a step of production of a wafer from a silicon material, a step of transferring a pattern of the reticle on to a wafer using an exposure apparatus of the present embodiment, a step of assembly of the device (including dicing, bonding, packaging, etc.), and an inspection step.

As explained above, according to the present invention, since there is no need for connecting various cables such as the cable for supplying power to the illuminance meter and a signal transfer cable for reading the measurement results of the illuminance meter, the problems arising along with the connection of cables such as obstruction of movement by the cables or breakage of the cables at the time of movement of the stage can be solved. As a result, the illuminance can be reliably measured within the predetermined time and the throughput can be improved.

Further, according to the present invention, since a holder type illuminance meter configured to be interchangeable with a wafer holder is provided, in addition to the above effects, there are the effects that the illuminance meter can be set using the transport system of the wafer holders and the work for measuring the illuminance can be made more efficient.

The present disclosure relates to subject matter contained in Japanese Patent Application No. 2000-083627, filed on Mar. 24, 2000, and Japanese Patent Application No. 2001-023812, filed on Jan. 31, 2001, the disclosure of which is expressly incorporated herein by reference in its entirety.

What is claimed is:

1. An illuminance measurement apparatus having a holder type illuminance meter comprised of a dummy holder that has an interchangeable form with a substrate holder for holding a substrate, the substrate holder is detachably attachable to a substrate stage, and the holder type illuminance meter further comprising a probe for measurement of the illuminance provided on the dummy holder, a transmitter provided on the dummy holder for wirelessly transmitting measurement results of the probe, and a battery for supplying power to the probe and the transmitter provided on the dummy holder.

2. An illuminance measurement apparatus according to claim 1, wherein said probe is detachably attachable to the dummy holder.

3. An illuminance measurement apparatus according to claim 1, further comprising a receiver which receives a wireless signal including the measurement results transmitted from the transmitter.

4. An illuminance measurement apparatus according to claim 1, wherein said holder type illuminance meter has a photoelectric converter for converting the received light photoelectrically and storing it in the battery.

5. An exposure apparatus which emits a first beam for exposure on a mask and exposes a substrate through the mask by the first beam, comprising:
a substrate stage to which a substrate holder for holding the substrate can be detachably attached,
a holder type illuminance meter comprised of a dummy holder that has an interchangeable form with a substrate holder, the substrate holder is detachably attachable to a substrate stage, and the holder type illuminance meter further comprising a probe provided on the dummy holder for receiving at least part of the first beam or second beam and converting it photoelectrically, a transmitter provided on the dummy holder for wirelessly transmitting information obtained from the probe, and a battery for supplying power to the probe and the transmitter provided on the dummy holder, and
a receiver which receives a wireless signal including the measurement results transmitted from the transmitter.

6. An exposure apparatus according to claim 5, wherein said probe is detachably attachable to the dummy holder.

7. An exposure apparatus according to claim 5, further comprising an energy generator which receives at least one of the first and second beams and generates energy to be stored in the battery.

8. An illuminance measurement apparatus which measures illuminance of an exposure beam in an exposure apparatus for exposing a photosensitive substrate, comprising:
a dummy holder that has an interchangeable form with a substrate holder on which the photosensitive substrate to be exposed by the exposure apparatus is placed;
a sensor disposed on the dummy holder and detecting illuminance of the exposure beam; and
a battery disposed on the dummy holder and supplying power to the sensor.

9. An illuminance measurement apparatus according to claim 8, further comprising:
a wireless transmitter disposed on the dummy holder and transmitting information on the illuminance of the exposure beam detected by the sensor; and
said battery disposed on the dummy holder supplying power both to the sensor and the wireless transmitter.

10. An illuminance measurement apparatus according to claim 9, wherein the battery is a rechargeable storage battery.

11. An illuminance measurement apparatus according to claim 10, wherein the sensor is disposed on a probe detachably attached to the dummy holder.

12. An illuminance measurement apparatus according to claim 10, wherein the dummy holder has a function of the substrate holder on which the photosensitive substrate is placed.

13. An exposure apparatus which exposes a substrate by an exposure beam through a mask pattern, comprising:
a stage to which a substrate holder for holding the substrate is detachably attached;
a holder type illuminance meter comprised of a dummy holder that has an interchangeable form with the substrate holder, and a sensor disposed on the dummy holder for detecting illuminance of the exposure beam; and a battery disposed on the dummy holder for supplying power to the sensor.

14. An exposure apparatus according to claim 13, further comprising:

a wireless transmitter disposed on the dummy holder and transmitting information on the illuminance of the exposure beam detected by the sensor;

said battery disposed on the dummy holder supplying power both to the sensor and the wireless transmitter; and a wireless receiver which receives the information transmitted by the wireless transmitter.

15. An exposure apparatus according to claim 14, wherein the battery is a rechargeable storage battery.

16. An exposure apparatus according to claim 15, wherein the sensor is disposed on a probe detachably attached to the dummy holder.

17. An exposure apparatus according to claim 15, wherein the dummy holder has a function of the substrate holder on which the substrate is placed.

18. A method for measuring illuminance of an exposure beam in an exposure apparatus for exposing a photosensitive substrate placed on a substrate holder on a stage, comprising the steps of:

placing a dummy holder on the stage in place of the substrate holder, wherein the dummy holder has an interchangeable form with the substrate holder, a sensor disposed on the dummy holder for detecting illuminance of the exposure beam, and a battery disposed on the dummy holder for supplying power to the sensor, moving the stage at a position where the sensor on the dummy holder is irradiated by the exposure beam, and detecting the illuminance of the exposure beam by using the sensor.

19. A method for measuring illuminance according to claim 18, further comprising the steps of:

transmitting information on the illuminance of the exposure beam detected by the sensor by a wireless transmitter disposed on the dummy holder; and receiving the information transmitted from the wireless transmitter by a wireless receiver.

20. An exposure method for exposing a photosensitive substrate by irradiating an exposure beam to the photosensitive substrate placed on a substrate holder on a stage, comprising the steps of:

placing a dummy holder on the stage in place of the substrate holder, wherein the dummy holder has an interchangeable form with the substrate holder, a sensor disposed on the dummy holder for detecting illuminance of the exposure beam, and a battery disposed on the dummy holder for supplying power to the sensor;

moving the stage at a position where the sensor on the dummy holder is irradiated by the exposure beam;

detecting the illuminance of the exposure beam by using the sensor; and controlling illuminance of the exposure beam based on the detected illuminance.

21. An exposure method according to claim 20, further comprising the steps of:

transmitting information on the illuminance of the exposure beam detected by the sensor by a wireless transmitter disposed on the dummy holder; and receiving the information transmitted from the wireless transmitter by a wireless receiver.

22. A method of producing a device comprising a step of transferring a device pattern onto a photosensitive substrate by using the exposure method according to claim 21.

23. An exposure apparatus which exposes a substrate by an exposure beam through a mask pattern, comprising:

a stage to which a substrate holder for holding a substrate is detachably attached;

a holder type illuminance meter comprised of a dummy holder that has an interchangeable form with the substrate holder, and a sensor disposed on the dummy holder for detecting illuminance of the exposure beam;

a holder transporter which loads and unloads the substrate holder or the dummy holder to and from the stage; and a battery disposed on the dummy holder and supplying power to the sensor.

24. An exposure apparatus according to claim 23, further comprising:

a wireless transmitter disposed on the dummy holder and transmitting information on illuminance of the exposure beam detected by the sensor;

said battery disposed on the dummy holder supplying power both to the sensor and the wireless transmitter; and a wireless receiver which receives the information transmitted by the wireless transmitter.

25. An exposure apparatus according to claim 24, wherein the battery is a rechargeable storage battery.

26. An exposure apparatus according to claim 25, wherein the sensor is disposed on a probe detachably attached to the dummy holder.

27. An exposure apparatus according to claim 23, wherein the dummy holder has a function of the substrate holder on which the substrate is placed.

28. An exposure method for exposing a photosensitive substrate by irradiating an exposure beam on the photosensitive substrate placed on a substrate holder on a stage, comprising the steps of:

loading a dummy holder in place of the substrate holder by using a transporter for loading the substrate holder onto the stage, wherein the dummy holder has an interchangeable form with the substrate holder, a sensor disposed on the dummy holder for detecting illuminance of the exposure beam, and a battery disposed on the dummy holder for supplying power to the sensor;

moving the stage at a position where the sensor on the dummy holder is irradiated by the exposure beam;

detecting the illuminance of the exposure beam by using the sensor; and controlling illuminance of the exposure beam based on the detected illuminance.

29. An exposure method according to claim 28, further comprising the steps of:

transmitting information on illuminance of the exposure beam detected by the sensor by a wireless transmitter disposed on the dummy holder; and receiving the information transmitted from the wireless transmitter by a wireless receiver.

30. A method of producing a device comprising a step of transferring a device pattern onto a photosensitive substrate by using the exposure method according to claim 29.

* * * * *